(12) United States Patent
Verdu et al.

(10) Patent No.: US 8,219,890 B2
(45) Date of Patent: *Jul. 10, 2012

(54) DENOISING AND ERROR CORRECTION FOR FINITE INPUT, GENERAL OUTPUT CHANNEL

(75) Inventors: Sergio Verdu, Princeton, NJ (US); Tsachy Weissman, Menlo Park, CA (US); Erik Ordentlich, San Jose, CA (US); Gadiel Seroussi, Cupertino, CA (US); Marcelo Weinberger, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 947 days.

This patent is subject to a terminal disclaimer.

(21) Appl. No.: 12/246,355

(22) Filed: Oct. 6, 2008

(65) Prior Publication Data

US 2009/0037795 A1 Feb. 5, 2009

Related U.S. Application Data

(62) Division of application No. 11/123,561, filed on May 6, 2005, now Pat. No. 7,434,146.

(51) Int. Cl.
*H03M 13/00* (2006.01)
(52) U.S. Cl. .................................. 714/776; 714/755
(58) Field of Classification Search .............. 714/755, 714/776
See application file for complete search history.

(56) References Cited

U.S. PATENT DOCUMENTS

| | | | |
|---|---|---|---|
| 4,835,772 A | 5/1989 | Peile et al. ............ 714/762 |
| 5,406,570 A | 4/1995 | Berrou et al. | |
| 5,559,831 A | 9/1996 | Keith ............... 375/240 |
| 5,771,244 A | 6/1998 | Reed et al. ............ 714/752 |
| 5,920,599 A | 7/1999 | Igarashi | |
| 5,968,198 A | 10/1999 | Hassan et al. | |
| 6,125,152 A | 9/2000 | Golden et al. ......... 375/340 |
| 6,205,256 B1 | 3/2001 | Chaddha ............ 382/253 |
| 6,252,917 B1 | 6/2001 | Freeman ............ 375/340 |
| 6,480,552 B1 | 11/2002 | Tonello ............. 375/265 |
| 6,499,128 B1 | 12/2002 | Gerlach et al. | |
| 6,581,179 B1 | 6/2003 | Hassan ............. 714/776 |
| 6,654,926 B1 | 11/2003 | Raphaelie et al. | |
| 6,725,409 B1 | 4/2004 | Wolf ............... 714/755 |
| 6,738,941 B1 | 5/2004 | Todoroki | |
| 6,785,859 B2 | 8/2004 | Goldman ............ 714/755 |

(Continued)

OTHER PUBLICATIONS

Rainer Bauer et al., Symbol-by-Symbol MAP Decoding of Variable Length Codes, Jan. 2000, Munich, Germany.

(Continued)

*Primary Examiner* — M. Mujtaba K Chaudry

(57) ABSTRACT

Systems and methods are disclosed for denoising for a finite input, general output channel. In one aspect, a system is provided for processing a noisy signal formed by a noise-introducing channel in response to an error correction coded input signal, the noisy signal having symbols of a general alphabet. The system comprises a denoiser and an error correction decoder. The denoiser generates reliability information corresponding to metasymbols in the noisy signal based on an estimate of the distribution of metasymbols in the input signal and upon symbol transition probabilities of symbols in the input signal being altered in a quantized signal. A portion of each metasymbol provides a context for a symbol of the metasymbol. The quantized signal includes symbols of a finite alphabet and is formed by quantizing the noisy signal. The error correction decoder performs error correction decoding on noisy signal using the reliability information generated by the denoiser.

18 Claims, 16 Drawing Sheets

U.S. PATENT DOCUMENTS

| | | | | |
|---|---|---|---|---|
| 6,868,518 | B2 | 3/2005 | Yuan et al. | 714/759 |
| 6,892,335 | B2 | 5/2005 | Gueguen | 714/701 |
| 6,981,203 | B2* | 12/2005 | Mills | 714/794 |
| 7,269,781 | B2 | 9/2007 | Weissman et al. | 714/780 |
| 2005/0097421 | A1 | 5/2005 | Weissman et al. | |
| 2006/0135081 | A1* | 6/2006 | Mysore et al. | 455/70 |

OTHER PUBLICATIONS

Rainer Bauer et al., Iterative Source/Channel-Decoding Using Reversible Variable Length Codes, Mar. 2000, Munich, Germany.

Rainer Bauer et al., On Variable Length Codes for Iterative Source/Channel Decoding, Mar. 2001, Munich, Germany.

Claude Berrou et al., Near Shannon Limit Error—Correcting Coding and Decoding : Turbo-Codes, Proceeding of the IEEE International Conference on Communications, 1993, (2):1064-1070, IEEE, New York, NY.

Maja Bystrom et al., Soft Source Decoding With Applications, IEEE Transactions on Circuits and Systems for Video Technology, 2001, 11(10):1108-1120, Oct. 2001, IEEE, New York, NY.

Giuseppe Caire et al., Almost-Noiseless Joint Source-Channel Coding-Decoding of Sources with Memory, 2004, Sophia Antipolis, France.

Amir Dembo et al., Universal Denoising for the Finite-Input-General-Output Channel, May 8, 2004, Stanford, CA.

Amir Dembo et al., Universal Denoising for the Finite-Input-General-Output Channel, Proceedings of International Symposium on Information Theory, Jun. 27, 2004, p. 199, IEEE, New York, NY.

Tim Fingscheidt et al., Combined Source/Channel Decoding: When Minimizing Bit Error Rate is Suboptimal, Jan. 2000, Munich, Germany.

Javier Garcia-Frias et al., Combining Hidden Markov Source Models and Parallel Concatenated Codes, IEEE Communications Letters, 1997, 1(4): 111-113, IEEE, New York, NY.

Javier Garcia-Frias et al., Joint Source-Channel Decoding of Correlated Sources over Noisy Channels, Proceedings of the Data Compression Conference. Mar. 2001, pp. 283-292, IEEE Computer Society, Washington D.C.

Javier Garcia-Frias et al., Joint Turbo Decoding and Estimation of Hidden Markov Sources, IEEE Journal on Selected Areas in Communications, Sep. 2001, 19(9):1671-1679, IEEE, New York, NY.

Norbert Görtz, Iterative Source-Channel Decoding using Soft-In/Soft-Out Decoders, Proceedings IEEE International Symposium on Information Theory, Jun. 2000, p. 173, IEEE New York, NY.

Norbert Görtz, on the Iterative Approximation of Optimal Joint Source-Channel Decoding, IEEE Journal on Selected Areas in Communications, Sep. 2001, 19(9):1662-1670, IEEE, New York, NY.

N. Görtz, A Generalized Framework for Iterative Source-Channel Decoding, Turbo Codes: Error-Correcting Codes of Widening Application (Ed. Michel Jézéquel et al.), May 2002, pp. 105-126, Kogan Page Science, London UK.

Joachim Hagenauer, Source-Controlled Channel Decoding, IEEE Transactions on Communications, 1995, 43(9):2449-2457, IEEE, New York, NY.

T. Hindelang et al., Combined Source/Channel (De-)Coding: Can A Priori Information Be Used Twice?, IEEE International Conference on Communications, Jun. 2000, (3):1208-1212, IEEE, New York, NY.

Thomas Hindelang et al., Source-Controlled Channel Decoding: Estimation of Correlated Parameters, 2000, Munich, Germany.

Ksenija Lakovic et al., Parallel Concatenated Codes for Iterative Source-Channel Decoding, Oct. 2001, Los Angeles, CA.

Erik Ordentlich et al., Channel Decoding of Systematically Encoded Unknown Redundant Sources, Proceedings of International Symposium on Information Theory, Jun. 27, 2004, p. 163, IEEE, New York, NY.

Erik Ordentlich et al., Channel Decoding of Systematically Encoded Unknown Redundant Sources, Slide Presentation, 2004 IEEE International Symposium on Information Theory, Jun. 29, 2004, Chicago, IL.

Tsachy Weissman et al., Universal Discrete Denoising, Proceedings of the 2002 IEEE information Theory Workshop, Oct. 2002, pp. 11-14, IEEE, New York, NY.

Tsachy Weissman et al., Universal Discrete Denoising: Known Channel, HP Labs: Tech Report: HPL-2003-29, Feb. 24, 2003, Hewlett-Packard, Palo Alto, CA.

Tsachy Weissman et al., U.S. Appl. No. 10/876,958, filed Jun. 25, 2004.

Tsachy Weissman et at., U.S. Appl. No. 10/887,933, filed Jun. 25, 2004.

Erik Ordentlich et al., U.S. Appl. No. 10/933,643, filed Sep. 2, 2004.

Erik Ordentlich et al., U.S. Appl. No. 11/116,895, filed Jun. 24, 2005.

Amir Dembo et al., Universal Denoising for the Finite-Input, General-Output Channel, IEEE Transactions on Information Theory, Apr. 2005, 51(4):1507-1517, IEEE, New York, NY.

Gil I. Shamir et al., Context Decoding of Low Density Parity Check Codes, 2005 Conference on Information Sciences and Systems, Mar. 16-18, 2005, The John Hopkins University, Baltimore MD.

* cited by examiner

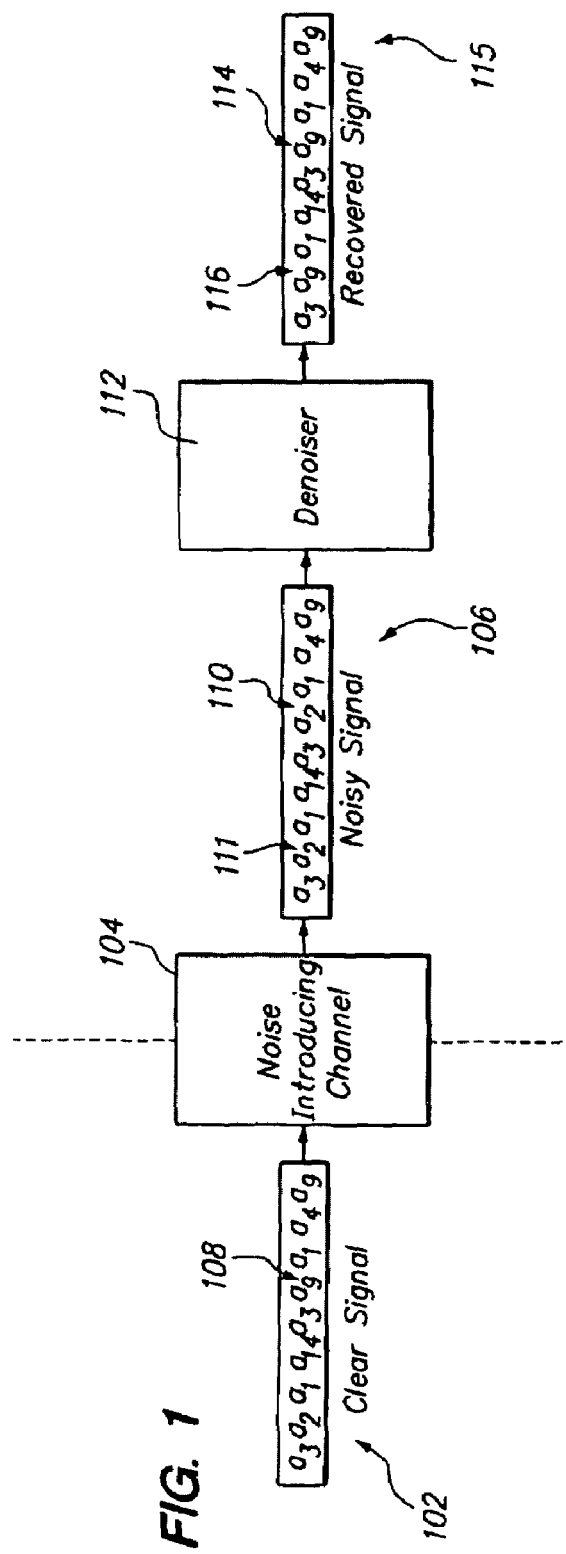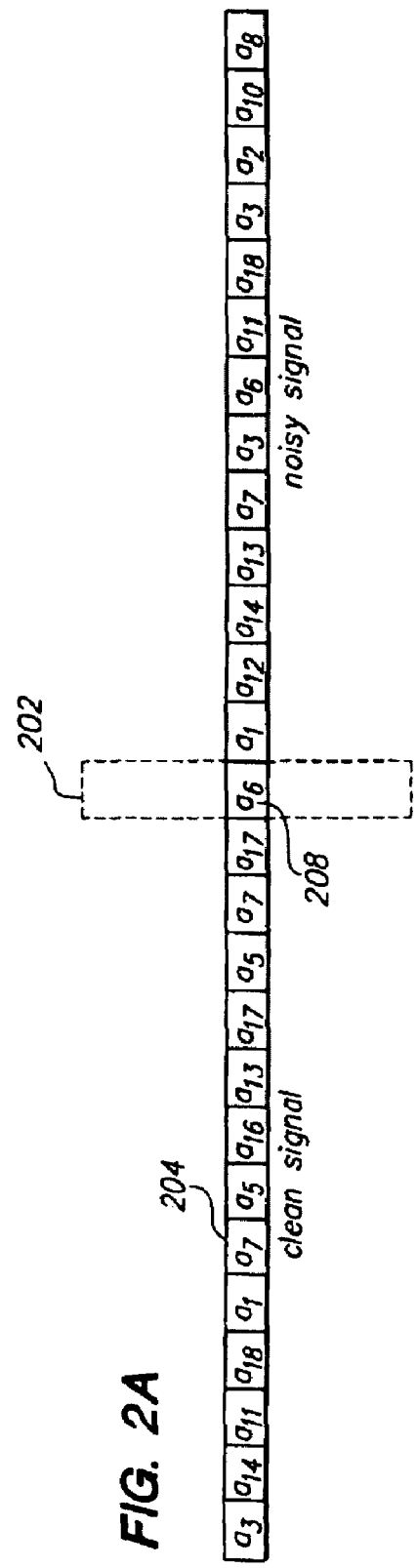

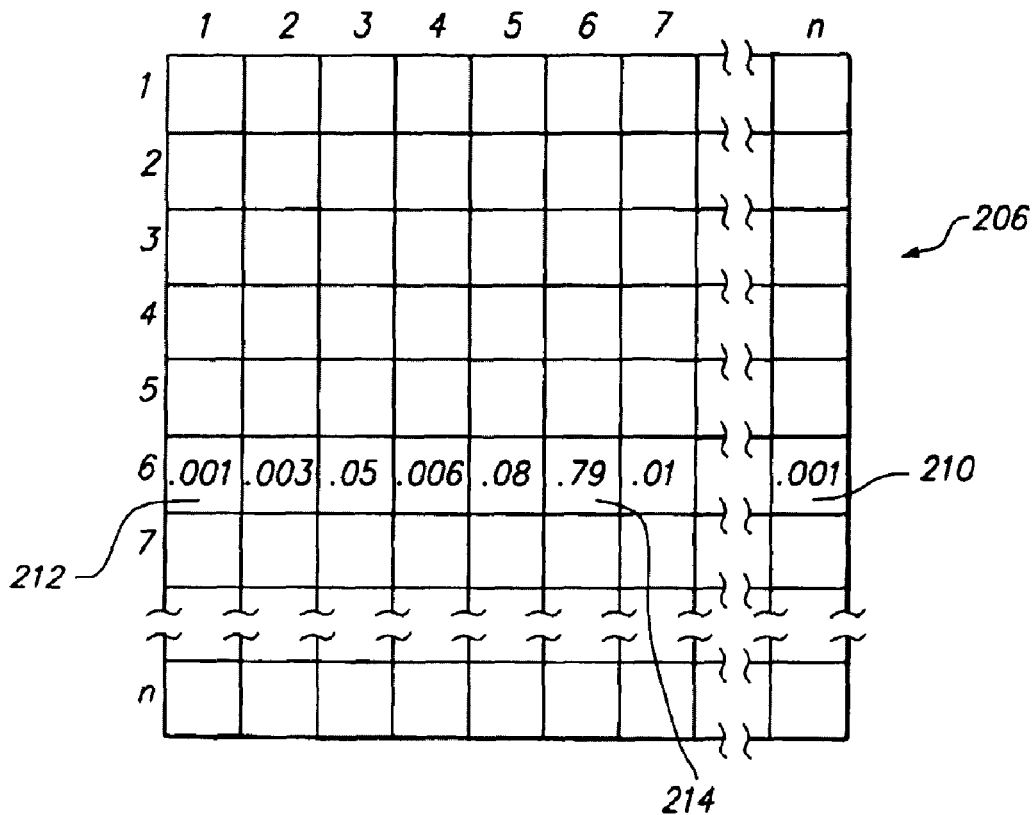

FIG. 2D

$$[m^{clean}[a_1], m^{clean}[a_2], \ldots, m^{clean}[a_n]] \times \begin{bmatrix} p_{a_1 \to a_1}, p_{a_1 \to a_2}, \ldots, p_{a_1 \to a_n} \\ p_{a_2 \to a_1}, p_{a_2 \to a_2}, \ldots, p_{a_2 \to a_n} \\ \vdots \\ p_{a_n \to a_1}, p_{a_n \to a_2}, \ldots, p_{a_n \to a_n} \end{bmatrix} = [m^{noisy}[a_1], m^{noisy}[a_2], \ldots, m^{noisy}[a_n]]$$

$$218 \qquad\qquad\qquad\qquad\qquad\qquad 222$$

$$m^{clean}[a_1]p_{a_1 \to a_1} + m^{clean}[a_2]p_{a_2 \to a_1} + m^{clean}[a_3]p_{a_3 \to a_1}, \ldots, + m^{clean}[a_n]p_{a_n \to a_1} \cong m^{noisy}[a_1]$$

$$m^{clean}[a_1]p_{a_1 \to a_2} + m^{clean}[a_2]p_{a_2 \to a_2} + m^{clean}[a_3]p_{a_3 \to a_2}, \ldots, + m^{clean}[a_n]p_{a_n \to a_2} \cong m^{noisy}[a_2]$$

$$\vdots$$

$$m^{clean}[a_1]p_{a_1 \to a_n} + m^{clean}[a_2]p_{a_2 \to a_n} + m^{clean}[a_3]p_{a_3 \to a_n}, \ldots, + m^{clean}[a_n]p_{a_n \to a_n} \cong m^{noisy}[a_n]$$

$$\begin{matrix} \lambda_1 & \lambda_2 & \lambda_3 & \cdots & \lambda_n \end{matrix}$$

$$\begin{bmatrix} d_{a_1 \to a_1} & d_{a_1 \to a_2} & d_{a_1 \to a_3} & \cdots & d_{a_1 \to a_n} \\ d_{a_2 \to a_1} & d_{a_2 \to a_2} & d_{a_2 \to a_3} & \cdots & d_{a_2 \to a_n} \\ d_{a_3 \to a_1} & d_{a_3 \to a_2} & d_{a_3 \to a_3} & \cdots & d_{a_3 \to a_n} \\ \vdots & \vdots & \vdots & & \vdots \\ d_{a_n \to a_1} & d_{a_n \to a_2} & d_{a_n \to a_3} & \cdots & d_{a_n \to a_n} \end{bmatrix}$$

FIG. 7

$$\begin{bmatrix} d_{a_1 \to a_x} \\ d_{a_2 \to a_x} \\ \vdots \\ d_{a_n \to a_x} \end{bmatrix} \odot \begin{bmatrix} p_{a_1 \to a_\alpha} \\ p_{a_2 \to a_\alpha} \\ p_{a_3 \to a_\alpha} \\ \vdots \\ p_{a_n \to a_\alpha} \end{bmatrix} = \begin{bmatrix} d_{a_1 \to a_x} \; p_{a_1 \to a_\alpha} \\ d_{a_2 \to a_x} \; p_{a_2 \to a_\alpha} \\ d_{a_3 \to a_x} \; p_{a_3 \to a_\alpha} \\ \vdots \\ d_{a_n \to a_x} \; p_{a_n \to a_\alpha} \end{bmatrix}$$

$\lambda_{a_x} \qquad\qquad \pi_{a_\alpha} \qquad\qquad \lambda_{a_x} \odot \pi_{a_\alpha}$

FIG. 8

$q^T(s_{noisy}, s_{clean}, b, c) \times \lambda_{a_x} \odot \pi_{a_\alpha}$ = distortion expected for replacing $a_\alpha$ in $ba_\alpha c$ in $s_{noisy}$ by $a_x$

FIG. 9
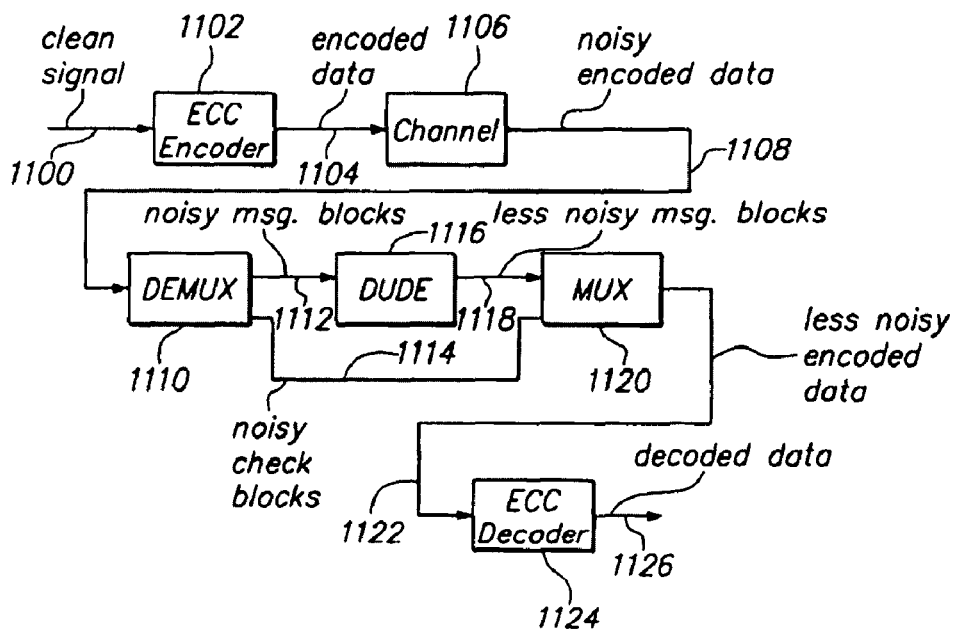
FIG. 11
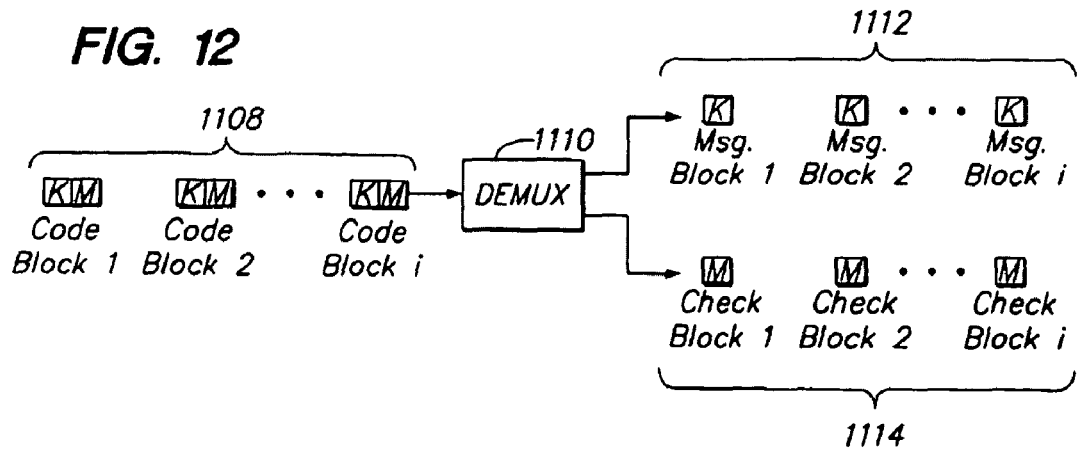
FIG. 12

FIG. 15

$$(m^T(s_{noisy\_1}, b, c)\Pi^{-1})[a_x]\Pi(a_x, a_3); \; x=1, 2, \cdots, n$$

| | | |
|---|---|---|
| $a_1$ | $(m^T(s_{noisy\_1}, b, c)\Pi^{-1})[a_1]\Pi(a_1, a_3)=1$ | 0.28% |
| $a_2$ | $(m^T(s_{noisy\_1}, b, c)\Pi^{-1})[a_2]\Pi(a_2, a_3)=7$ | 1.9% |
| $a_3$ | $(m^T(s_{noisy\_1}, b, c)\Pi^{-1})[a_3]\Pi(a_3, a_3)=289$ | 80% |
| $a_4$ | $(m^T(s_{noisy\_1}, b, c)\Pi^{-1})[a_4]\Pi(a_4, a_3)=2$ | 0.55% |
| $a_5$ | $(m^T(s_{noisy\_1}, b, c)\Pi^{-1})[a_5]\Pi(a_5, a_3)=6$ | 1.7% |
| $a_6$ | $(m^T(s_{noisy\_1}, b, c)\Pi^{-1})[a_6]\Pi(a_6, a_3)=3$ | 0.83% |
| $a_7$ | $(m^T(s_{noisy\_1}, b, c)\Pi^{-1})[a_7]\Pi(a_7, a_3)=4$ | 1.1% |
| $a_8$ | $(m^T(s_{noisy\_1}, b, c)\Pi^{-1})[a_8]\Pi(a_8, a_3)=1$ | 0.28% |
| $a_9$ | $(m^T(s_{noisy\_1}, b, c)\Pi^{-1})[a_9]\Pi(a_9, a_3)=2$ | 0.55% |
| $a_{10}$ | $(m^T(s_{noisy\_1}, b, c)\Pi^{-1})[a_{10}]\Pi(a_{10}, a_3)=5$ | 1.4% |
| $a_{11}$ | $(m^T(s_{noisy\_1}, b, c)\Pi^{-1})[a_{11}]\Pi(a_{11}, a_3)=7$ | 1.9% |
| $a_{12}$ | $(m^T(s_{noisy\_1}, b, c)\Pi^{-1})[a_{12}]\Pi(a_{12}, a_3)=8$ | 2.2% |
| $a_{13}$ | $(m^T(s_{noisy\_1}, b, c)\Pi^{-1})[a_{13}]\Pi(a_{13}, a_3)=4$ | 1.1% |
| $a_{14}$ | $(m^T(s_{noisy\_1}, b, c)\Pi^{-1})[a_{14}]\Pi(a_{14}, a_3)=11$ | 3.0% |
| $a_{15}$ | $(m^T(s_{noisy\_1}, b, c)\Pi^{-1})[a_{15}]\Pi(a_{15}, a_3)=2$ | 0.55% |
| $a_n$ | $(m^T(s_{noisy\_1}, b, c)\Pi^{-1})[a_n]\Pi(a_n, a_3)=9$ | 2.5% | ure a noisy signal and subsequent denoising of the noisy
DENOISING AND ERROR CORRECTION FOR FINITE INPUT, GENERAL OUTPUT CHANNEL

CROSS-REFERENCE TO RELATED APPLICATIONS

This patent application is a divisional patent application of and claims priority from U.S. patent application Ser. No. 11/123,561, filed May 6, 2005, now U.S. Pat. No. 7,434,146, entitled "Denoising And Error Correction For Finite Input, General Output Channel" having the same inventors, and which is incorporated by reference in its entirety.

FIELD OF THE INVENTION

The present invention is related to methods and systems for denoising noisy signals received from noise-introducing channels.

BACKGROUND OF THE INVENTION

A large body of mathematical and computational techniques has been developed in the area of reliable signal transmission through noise-introducing channels. These different techniques depend on assumptions made with regard to the noise-introducing channel, as well as on the amount and nature of information available, during denoising, regarding the original signal. The denoising process may be characterized by various computational efficiencies, including the time complexity and working-data-set complexity for a particular computational method, as well as by the amount of distortion, or noise, remaining in a recovered signal following denoising with respect to the originally transmitted, clean signal.

Although methods and systems for denoising noisy signals have been extensively studied, and signal denoising is a relatively mature field, developers, vendors, and users of denoising methods and systems, and of products that rely on denoising, continue to recognize the need for improved denoising techniques. In particular, there is a need for methods and systems for recovering a signal from its noise-corrupted observations where the noise-corrupted observations are of a general or continuous alphabet.

SUMMARY OF THE INVENTION

The present invention comprises systems and methods for denoising for a finite input, general output channel. In one aspect, a system is provided for processing a noisy signal formed by a noise-introducing channel in response to an error correction coded input signal, the noisy signal having symbols of a general alphabet. The system comprises a denoiser and an error correction decoder. The denoiser generates reliability information corresponding to metasymbols in the noisy signal based on an estimate of the distribution of metasymbols in the input signal and upon symbol transition probabilities of symbols in the input signal being altered in a quantized signal. A portion of each metasymbol provides a context for a symbol of the metasymbol. The quantized signal includes symbols of a finite alphabet and is formed by quantizing the noisy signal. The error correction decoder performs error correction decoding on the noisy signal using the reliability information generated by the denoiser.

These and other aspects of the invention are described in more detail herein.

BRIEF DESCRIPTION OF THE DRAWINGS

FIG. 1 illustrates introduction of noise into a clean signal to produce a noisy signal and subsequent denoising of the noisy signal to produce a recovered signal;

FIGS. 2A-D illustrate a motivation for a discrete, universal denoiser related to characteristics of the noise-introducing channel;

FIG. 7 illustrates computation of the relative distortion expected from replacing a symbol "$a_\alpha$" in a received, noisy signal by the symbol "$a_x$";

FIG. 8 illustrates use of the column vector $\lambda_{a_x} \sqcap \Pi_{a_\alpha}$ to compute a distortion expected for replacing the center symbol $a_\alpha$ in the metasymbol $ba_\alpha c$ in a noisy signal "$s_{noisy}$" by the replacement symbol $a_x$;

FIG. 9 shows estimation of the counts of the occurrences of symbols "$a_1$"-"$a_n$" for the clean signal;

FIG. 11 illustrates a system for denoising and for performing error correction on a signal in accordance with an embodiment of the present invention;

FIG. 12 illustrates operation of a de-multiplexer for use in an embodiment of the present invention;

FIG. 15 illustrates an estimated conditional distribution and probabilities in accordance with an embodiment of the present invention;

DETAILED DESCRIPTION OF A PREFERRED EMBODIMENT

Figure 3A:
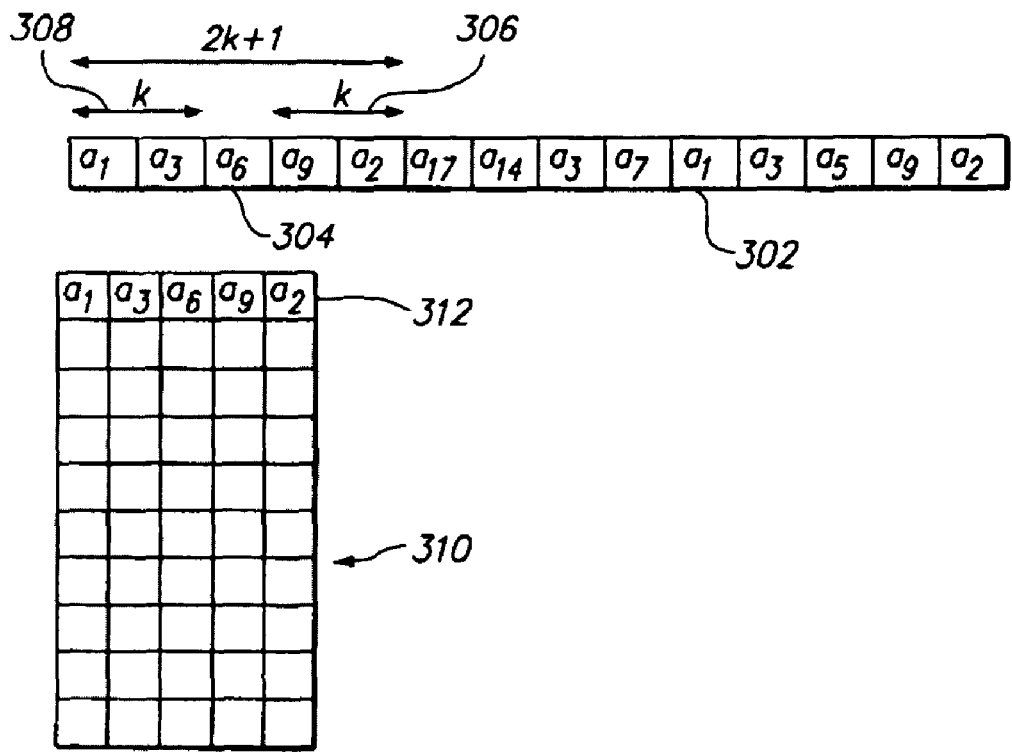
FIGS. 3A-D illustrate a context-based, sliding window approach by which a discrete, universal denoiser characterizes the occurrences of symbols in a noisy signal.

Embodiments of the present invention are related to denoising methods and systems, and in particular, to discrete, universal denoising systems and methods. A discrete, universal denoising method, referred to as "DUDE," is described, below, in a first subsection, followed by a discussion, in a second subsection, of various embodiments of the present invention.

DUDE

FIG. 1 illustrates introduction of noise into a clean signal to produce a noisy signal and subsequent denoising of the noisy signal to produce a recovered signal. In FIG. 1, signals are represented as sequences of symbols that are each members of an alphabet A having n distinct symbols, where A is:

$$A=(a_1, a_2, a_3, \ldots a_n)$$

Note that the subscripts refer to the positions of the respective symbols within an ordered listing of the different symbols of the alphabet, and not to the positions of symbols in a signal. In FIG. 1, an initial, clean signal 102 comprises an ordered sequence of nine symbols from the alphabet A. In normal circumstances, an input signal would generally have thousands, millions, or more symbols. The short input signal 102 is used for illustrative convenience.

The clean signal 102 is transmitted or passed through a noise-introducing channel 104, producing a noisy signal 106. In the example shown in FIG. 1, the output signal 106 comprises symbols from the same alphabet as the input signal 102, although, in general, the input symbols may be chosen from a different, equally sized or smaller alphabet than that from which the output symbols are selected. In the example shown in FIG. 1, the sixth symbol in the clean signal 108, "$a_9$" is altered by the noise-introducing channel to produce the symbol "$a_2$" 110 in the noisy signal 106. There are many different types of noise-introducing channels, each type characterized by the types and magnitudes of noise that the noise-introducing channel introduces into a clean signal. Examples of noise-introducing channels include electronic communications media, data storage devices to which information is transferred and from which information is extracted, and transmission and reception of radio and television signals. In this discussion, a signal is treated as a linear, ordered sequence of symbols, such as a stream of alphanumeric characters that comprise a text file, but the actual data into which noise is introduced by noise-introducing channels in real world situations may include two-dimensional images, audio signals, video signals, and other types of displayed and broadcast information.

In order to display, broadcast, or store a received, noisy signal with reasonable fidelity with respect to the initially transmitted clean signal, a denoising process may be undertaken to remove noise introduced into the clean signal by a noise-introducing channel. In FIG. 1, the noisy signal 106 is passed through, or processed by, a denoiser 112 to produce a recovered signal 114 which, when the denoising process is effective, is substantially closer to, or more perceptually similar to, the originally transmitted clean signal than to the received noisy signal.

Many types of denoisers have been proposed, studied, and implemented. Some involve application of continuous mathematics, some involve detailed knowledge of the statistical properties of the originally transmitted clean signal, and some rely on detailed information concerning time and sequence-dependent behavior of the noise-introducing channel. The following discussion describes a discrete, universal denoiser, referred to as "DUDE," related to the present invention. The DUDE is discrete in the sense that the DUDE processes signals comprising discrete symbols using a discrete algorithm, rather than continuous mathematics. The DUDE is universal in that it asymptotically approaches the performance of an optimum denoiser employing knowledge of the clean-signal symbol-occurrence distributions without access to these distributions.

The DUDE implementation is motivated by a particular noise-introducing-channel model and a number of assumptions. These are discussed below. However, DUDE may effectively function when the model and assumptions do not, in fact, correspond to the particular characteristics and nature of a noise-introducing channel. Thus, the model and assumptions motivate the DUDE approach, but the DUDE has a much greater range of effectiveness and applicability than merely to denoising signals corrupted by a noise-introducing channel corresponding to the motivating model and assumptions.

As shown in FIG. 1, the DUDE 112 employs a particular strategy for denoising a noisy signal. The DUDE considers each symbol within a context generally comprising one or more symbols preceding and following the symbol according to a left to right ordering. For example, in FIG. 1, the two occurrences of the symbol "$a_2$" in the noisy signal 106 occur within the same single preceding-and-following-symbol context. The full context for the two occurrences of the symbol "$a_2$" in the noisy signal 106 of the example in FIG. 1 is ["$a_3$," "$a_1$"]. The DUDE either leaves all symbols of a particular type "$a_i$" within a particular context unchanged, or changes all occurrences of a particular type of symbol "$a_i$" within a particular context to a different symbol "$a_j$." For example, in FIG. 1, the denoiser has replaced all occurrences of the symbol "$a_2$" 110 and 112 in the noisy signal within the full context ["$a_3$," "$a_1$"] with the symbol "$a_9$" 114 and 116 in the recovered symbol. Thus, the DUDE does not necessarily produce a recovered signal identical to the originally transmitted clean signal, but instead produces a denoised, recovered signal estimated to have less distortion with respect to the clean signal than the noisy signal. In the above example, replacement of the second symbol "$a_2$" 110 with the symbol "$a_9$" 114 restores the originally transmitted symbol at that position, but replacement of the first occurrence of symbol "$a_2$" 112 in the noisy signal with the symbol "$a_9$" 116 introduces a new distortion. The DUDE only replaces one symbol with another to produce the recovered signal when the DUDE estimates that the overall distortion of the recovered signal with respect to the clean signal will be less than the distortion of the noisy signal with respect to the clean signal.

FIGS. 2A-D illustrate a motivation for DUDE related to characteristics of the noise-introducing channel. DUDE assumes a memory-less channel. In other words, as shown in FIG. 2A, the noise-introducing channel 202 may be considered to act as a one-symbol window, or aperture, through which a clean signal 204 passes. The noise-introducing channel 202 corrupts a given clean-signal symbol, replacing the given symbol with another symbol in the noisy signal, with an estimateable probability that depends neither on the history of symbols preceding the symbol through the noise-introducing channel nor on the symbols that are subsequently transmitted through the noise-introducing channel.

FIG. 2B shows a portion of a table 206 that stores the probabilities that any particular symbol from the alphabet A, "$a_i$," may be corrupted to a symbol "$a_j$" during transmission through the noise-introducing channel. For example, in FIG. 2A, the symbol "$a_6$" 208 is currently passing through the noise-introducing channel. Row 210 in table 206 contains the probabilities that symbol "$a_6$" will be corrupted to each of the different, possible symbols in the alphabet A. For example, the probability that the symbol "$a_6$" will be changed to the symbol "$a_1$" 212 appears in the first cell of row 210 in table 206, indexed by the integers "6" and "1" corresponding to the positions of symbols "$a_6$" and "$a_1$" in the alphabet A. The probability that symbol "$a_6$" will be faithfully transferred, without corruption, through the noise-introducing channel 214 appears in the table cell with indices (6, 6), the probability of symbol "$a_6$" being transmitted as the symbol "$a_6$." Note that the sum of the probabilities in each row of the table 206 is 1.0, since a given symbol will be transmitted by the noise-introducing channel either faithfully or it will be corrupted to some other symbol in alphabet A. As shown in FIG. 2C, table 206 in FIG. 2B can be alternatively expressed as a two-dimensional matrix $\Pi$ 216, with the matrix element identified by indices (i, j) indicating the probability that symbol "$a_i$" will be transmitted by the noise-introducing channel as symbol "$a_j$." Note also that a column j in matrix $\Pi$ may be referred to as "$\pi_j$" or $\pi_{a_j}$.

As shown in FIG. 2D, a row vector 218 containing the counts of the number of each type of symbol in the clean signal, where, for example, the number of occurrences of the symbol "$a_5$" in the clean signal appears in the row vector as $m^{clean}[a_5]$, can be multiplied by the symbol-transition-probability matrix $\Pi$ 220 to produce a row vector 222 containing the expected counts for each of the symbols in the noisy signal. The actual occurrence counts of symbols "$a_i$" in the noisy signal appear in the row vector $m^{noisy}$. The matrix multiplication is shown in expanded form 224 below the matrix multiplication in FIG. 2D. Thus, in vector notation:

$$m^{clean}\Pi \cong m^{noisy}$$

where $m^{clean}$ is a row vector containing the occurrence counts of each symbol $a_i$ in alphabet A in the clean signal; and
$m^{noisy}$ is a row vector containing the occurrence counts of each symbol $a_i$ in alphabet A in the noisy signal.

The approximation symbol $\cong$ is employed in the above equation, because the probabilities in the matrix $\Pi$ give only the expected frequency of a particular symbol substitution, while the actual symbol substitution effected by the noise-introducing channel is random. In other words, the noise-introducing channel behaves randomly, rather than deterministically, and thus may produce different results each time a particular clean signal is transmitted through the noise-introducing channel. The error in the approximation, obtained as the sum of the absolute values of the components of the difference between the left and right sides of the approximation, above, is generally small relative to the sequence length, on the order of the square root of the sequence length. Multiplying, from the right, both sides of the above equation by the inverse of matrix $\Pi$, assuming that $\Pi$ is invertible, allows for calculation of an estimated row-vector count of the symbols in the clean signal, $\hat{m}^{clean}$, from the counts of the symbols in the noisy signal, as follows:

$$\hat{m}^{clean} = m^{noisy}\Pi^{-1}$$

In the case where the noisy symbol alphabet is larger than the clean symbol alphabet, it is assumed that $\Pi$ is full-row-rank and the inverse in the above expression can be replaced by a generalized inverse, such as the Moore-Penrose generalized inverse.

As will be described below, the DUDE applies clean symbol count estimation on a per-context basis to obtain estimated counts of clean symbols occurring in particular noisy symbol contexts. The actual denoising of a noisy symbol is then determined from the noisy symbol's value, the resulting estimated context-dependent clean symbol counts, and a loss or distortion measure, in a manner described below.

As discussed above, the DUDE considers each symbol in a noisy signal within a context. The context may be, in a 1-dimensional signal, such as that used for the example of FIG. 1, the values of a number of symbols preceding, following, or both preceding and following a currently considered signal. In 2-dimensional or higher dimensional signals, the context may be values of symbols in any of an almost limitless number of different types of neighborhoods surrounding a particular symbol. For example, in a 2-dimensional image, the context may be the eight pixel values surrounding a particular, interior pixel. In the following discussion, a 1-dimensional signal is used for examples, but higher dimensional signals can be effectively denoised by the DUDE.

In order to consider occurrences of symbols within contexts in the 1-dimensional-signal case, the DUDE needs to consider a number of symbols adjacent to each, considered symbol. FIGS. 3A-D illustrate a context-based, sliding window approach by which the DUDE characterizes the occurrences of symbols in a noisy signal. FIGS. 3A-D all employ the same illustration conventions, which are described only for FIG. 3A, in the interest of brevity. In FIG. 3A, a noisy signal 302 is analyzed by DUDE in order to determine the occurrence counts of particular symbols within particular contexts within the noisy signal. The DUDE employs a constant k to describe the length of a sequence of symbols preceding, and the length of a sequence of symbols subsequent to, a particular symbol that, together with the particular symbol, may be viewed as a metasymbol of length 2k+1. In the example of FIGS. 3A-D, k has the value "2." Thus, a symbol preceded by a pair of symbols and succeeded by a pair of symbols can be viewed as a five-symbol metasymbol. In FIG. 3A, the symbol "$a_6$" 304 occurs within a context of the succeeding k-length symbol string "$a_9a_2$" 306 and is preceded by the two-symbol string "$a_1a_3$" 308. The symbol "$a_6$" therefore occurs at least once in the noisy signal within the context ["$a_1a_3$," "$a_9a_2$"], or, in other words, the metasymbol "$a_1a_3a_6a_9a_2$" occurs at least once in the noisy signal. The occurrence of this metasymbol within the noisy signal 302 is listed within a table 310 as the first five-symbol metacharacter 312.

Figure 3B:
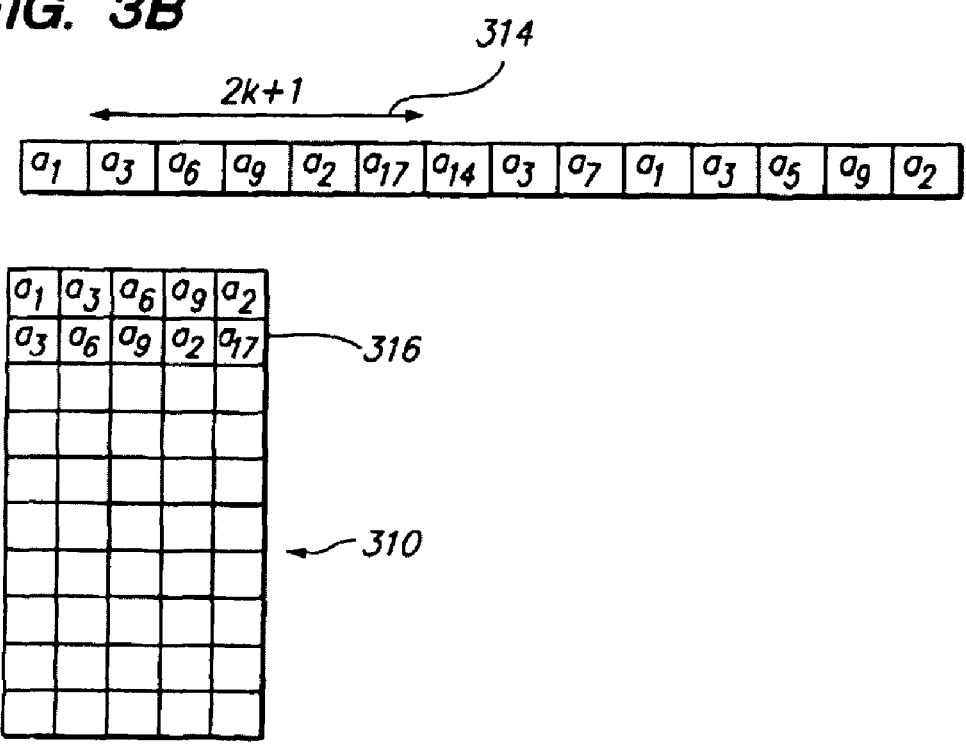
Figure 3C:
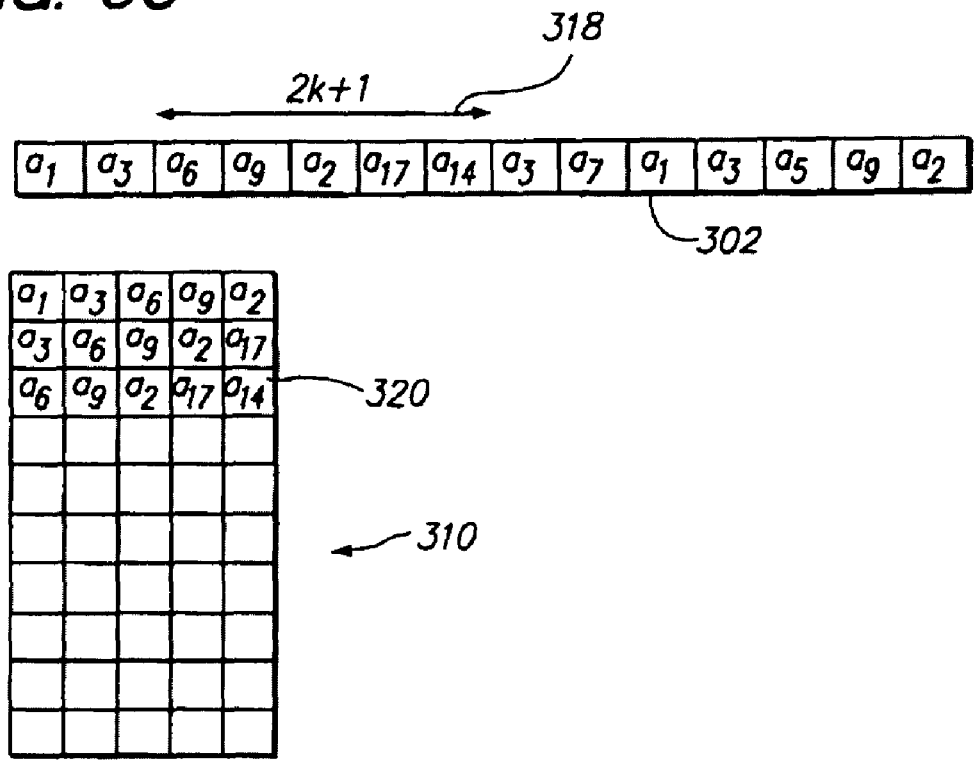
Figure 3D:
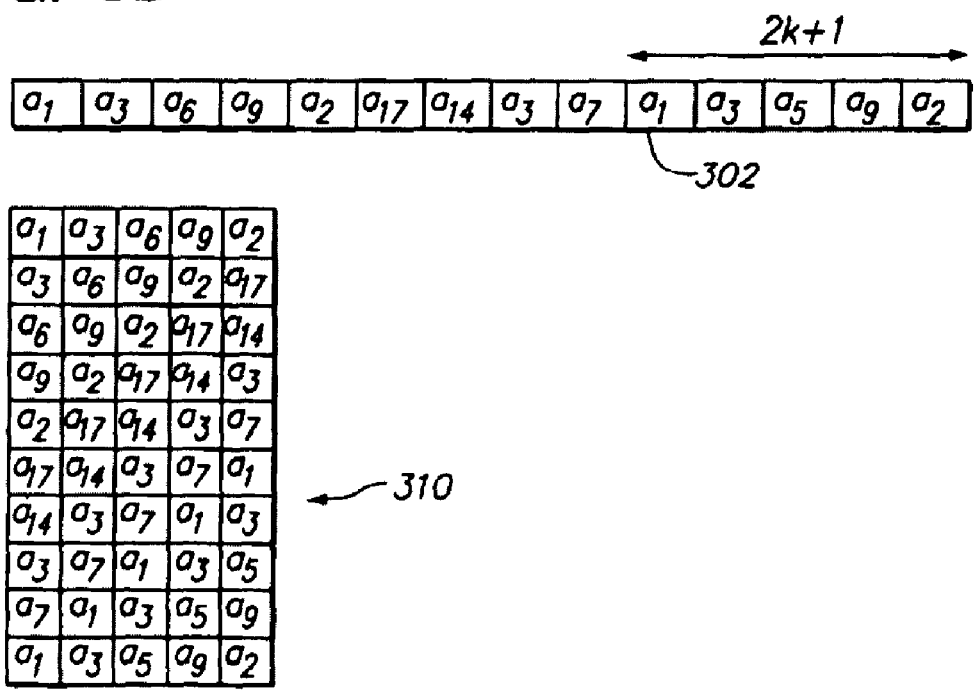

As shown in FIG. 3B, DUDE then slides the window of length 2k+1 rightward, by one symbol, to consider a second metasymbol 314 of length 2k+1. In this second metasymbol, the symbol "$a_9$" appears within the context ["$a_3a_6$," "$a_2a_{17}$"]. This second metasymbol is entered into table 310 as the second entry 316. FIG. 3C shows detection of a third metasymbol 318 in the noisy signal 302 and entry of the third metasymbol into table 310 as entry 320. FIG. 3D shows the table 310 following complete analysis of the short noisy signal 302 by DUDE. Although, in the examples shown in FIG. 3-D, DUDE lists each metasymbol as a separate entry in the table, in a more efficient implementation, DUDE enters each detected metasymbol only once in an index table, and increments an occurrence count each time the metasymbol is subsequently detected. In this fashion, in a first pass, DUDE tabulates the frequency of occurrence of metasymbols within the noisy signal or, viewed differently, DUDE tabulates the occurrence frequency of symbols within contexts comprising k preceding and k subsequent symbols surrounding each symbol.

Figure 4:
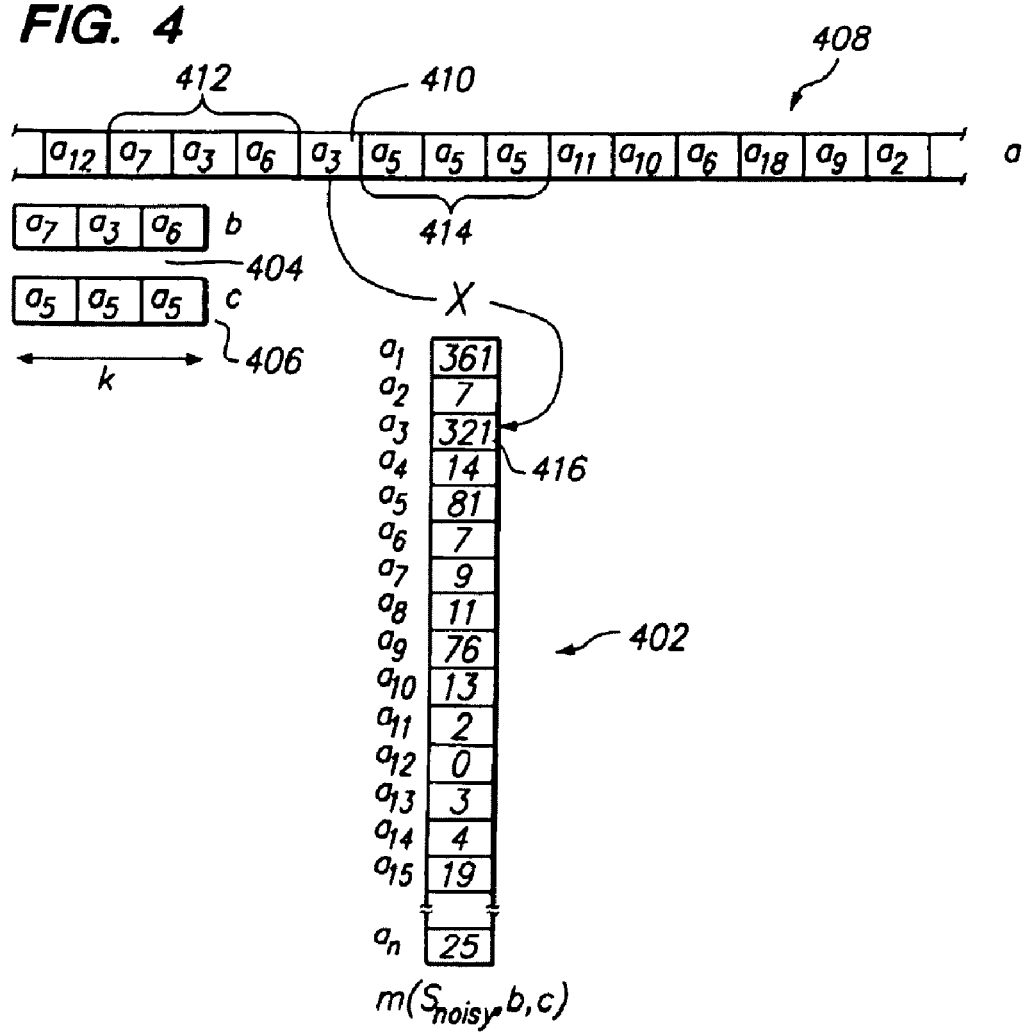
FIG. 4 illustrates a convenient mathematical notation and data structure representing a portion of the metasymbol table constructed by a discrete, universal denoiser, as described with reference to FIGS. 3A-D.

FIG. 4 illustrates a convenient mathematical notation and data structure representing a portion of the metasymbol table constructed by DUDE, as described with reference to FIGS. 3A-D. The column vector $m(s_{noisy},b,c)$ 402 represents a count of the occurrences of each symbol in the alphabet A within a particular context, represented by the k-length symbol vectors b and c, within the noisy signal $s_{noisy}$, where the noisy signal is viewed as a vector. In FIG. 4, for example, the context value for which the occurrence counts are tabulated in column vector $m(s_{noisy},b,c)$ comprises the symbol vector 404 and the symbol vector 406, where k has the value 3. In the noisy signal $s_{noisy}$ 408, the symbol "$a_3$" 410 occurs within the context comprising three symbols 412 to the left of the symbol "$a_3$" 410 and three symbols 414 to the right of the symbol "$a_3$". This particular context has a value equal to the combined values of symbol vectors 404 and 406, denoted ["$a_7a_3a_6$," "$a_5a_5a_5$"] and this occurrence of the symbol "$a_3$" 410 within the context ["$a_7a_3a_6$," "$a_5a_5a_5$"], along with all other occurrences of the symbol "$a_3$" in the context ["$a_7a_3a_6$," "$a_5a_5a_5$"], is noted by a count 416 within the column vector $m(s_{noisy}, b, c)$, with $[b,c]=["a_7a_3a_6," "a_5a_5a_5"]$. In other words, a symbol "$a_3$" occurs within the context ["$a_7a_3a_6$," "$a_5a_5a_5$"] in the noisy signal $s_{noisy}$ 321 times. The counts for the occurrences of all other symbols "$a_1$", "$_2$", and "$a_4$"-"$a_n$" in the context ["$a_7a_3a_6$," "$a_5a_5a_5$"] within noisy signal $s_{noisy}$ are recorded in successive elements of the column vector $m(s_{noisy}, "a_7a_3a_6", "a_5a_5a_5")$. An individual count within a column vector $m(s_{noisy},b,c)$ can be referred to using an array-like notation. For example, the count of the number of times that the symbol "$a_3$" appears in the context ["$a_7a_3a_6$," "$a_5a_5a_5$"] within the noisy signal $s_{noisy}$, 321, can be referred to as $m(s_{noisy}, "a_7a_3a_6", "a_5a_5a_5")[a_3]$.

DUDE employs either a full or a partial set of column vectors for all detected contexts of a fixed length 2k in the noisy signal in order to denoise the noisy signal. Note that an initial set of symbols at the beginning and end of the noisy signal of length k are not counted in any column vector $m(s_{noisy},b,c)$ because they lack either sufficient preceding or subsequent symbols to form a metasymbol of length 2k+1. However, as the length of the noisy signal for practical problems tends to be quite large, and the context length k tends to be relatively small, DUDE's failure to consider the first and final k symbols with respect to their occurrence within contexts makes almost no practical different in the outcome of the denoising operation.

Figure 5A:
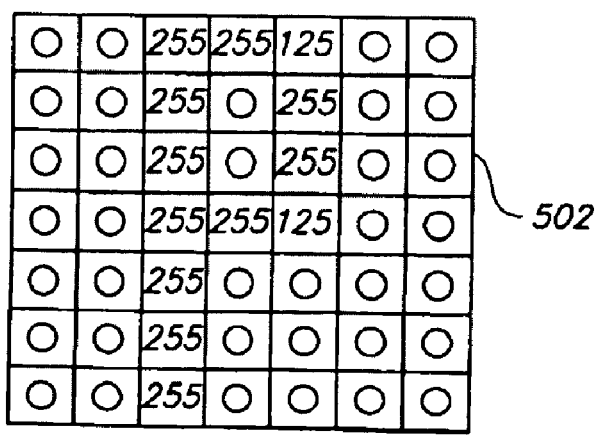
FIGS. 5A-D illustrate the concept of symbol-corruption-related distortion in a noisy or recovered signal.
Figures 5B, 5C:
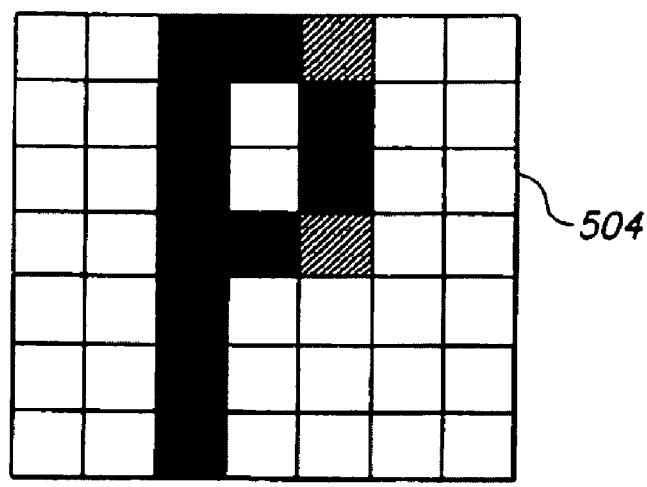

FIGS. 5A-D illustrate the concept of symbol-corruption-related distortion in a noisy or recovered signal. The example of FIGS. 5A-D relates to a 256-value gray scale image of a letter. In FIG. 5A, the gray-scale values for cells, or pixels, within a two-dimensional image 502 are shown, with the character portions of the symbol generally having a maximum gray-scale value of 255 and the background pixels having a minimum gray-scale value of zero, using a convention that the displayed darkness of the pixel increases with increasing numerical value. Visual display of the image represented by the two-dimensional gray-scale signal in FIG. 5A is shown in FIG. 5B 504. The gray-scale data in FIG. 5A is meant to represent a low resolution image of the letter "P." As shown in FIG. 5B, the image of the letter "P" is reasonably distinct, with reasonably high contrast.

Figures 5D, 6:
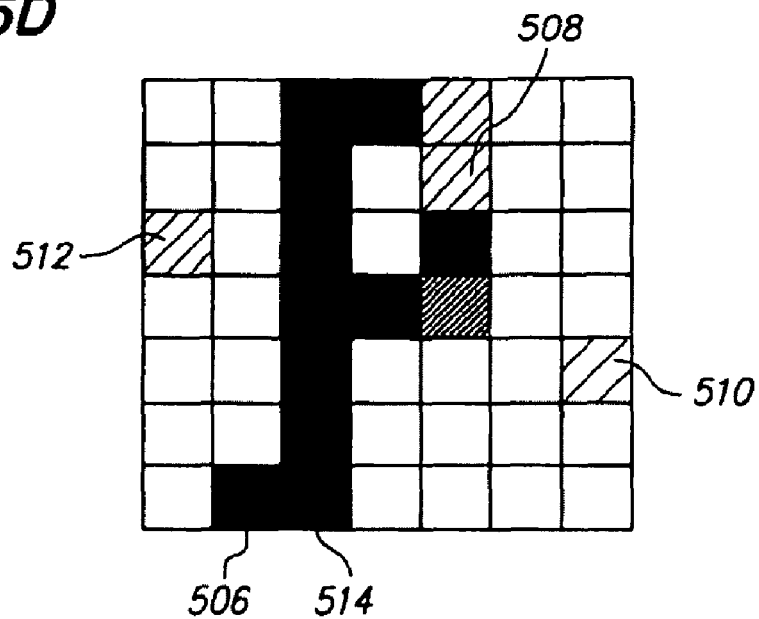
FIG. 6 displays one form of the symbol-transformation distortion matrix $\Lambda$.

FIG. 5C shows the gray-scale data with noise introduced by transmission through a hypothetical noise-introducing channel. Comparison of FIG. 5C to FIG. 5A shows that there is marked difference between the gray-scale values of certain cells, such as cell 506, prior to, and after, transmission. FIG. 5D shows a display of the gray-scale data shown in FIG. 5C. The displayed image is no longer recognizable as the letter "P." In particular, two cells contribute greatly to the distortion of the figure: (1) cell 506, changed in transmission from the gray-scale value "0" to the gray-scale value "223"; and (2) cell 508, changed in transmission from the gray-scale value "255" to the gray-scale value "10." Other noise, such as the relatively small magnitude gray-scale changes of cells 510 and 512, introduce relatively little distortion, and, by themselves, would have not seriously impacted recognition of the letter "P." In this case, the distortion of the displayed image contributed by noise introduced into the gray-scale data appears to be proportional to the magnitude of change in the gray-scale value. Thus, the distorting effects of noise within symbols of a signal are not necessarily uniform. A noise-induced change of a transmitted symbol to a closely related, received symbol may produce far less distortion than a noise-induced change of a transmitted symbol to a very different, received symbol.

The DUDE models the non-uniform distortion effects of particular symbol transitions induced by noise with a matrix Λ. FIG. 6 displays one form of the symbol-transformation distortion matrix Λ. An element $d_{a_i \to a_j}$ of the matrix Λ provides the relative distortion incurred by substituting the symbol "$a_j$" in the noisy or recovered signal for the symbol "$a_i$" in the clean signal. An individual column j of the matrix Λ may be referred to as $\lambda_j$ or $\lambda_{a_j}$.

FIG. 7 illustrates computation of the relative distortion, with respect to the clean signal, expected from replacing a symbol "$a_\alpha$" in a received, noisy signal by the symbol "$a_x$." As shown in FIG. 7, element-by-element multiplication of the elements of the column vectors $\lambda_{a_x}$ and $\pi_{a_\alpha}$, an operation known as the Schur product of two vectors, and designated in the current discussion by the symbol ⊡ produces the column vector $\lambda_{a_x} \boxdot \pi_{a_\alpha}$ in which the i-th element is the product of a distortion and probability, $d_{a_i \to a_j} p_{a_j \to a_\alpha}$, reflective of the relative distortion expected in the recovered signal by replacing the symbol $a_\alpha$ in the noisy symbol by the symbol "$a_x$" when the symbol in the originally transmitted, clean signal is "$a_i$."

FIG. 8 illustrates use of the column vector $\lambda_{a_x} \boxdot \Pi_{a_\alpha}$ to compute a distortion expected for replacing "$a_\alpha$" in the metasymbol $ba_\alpha c$ in a noisy signal $s_{noisy}$ by the replacement symbol "$a_x$". In the following expression, and in subsequent expressions, the vectors $s_{noisy}$ and $s_{clean}$ denote noisy and clean signals, respectively. A different column vector q can be defined to represent the occurrence counts for all symbols in the clean signal that appear at locations in the clean signal that correspond to locations in the noisy signal around which a particular context [b, c] occurs. An element of the column vector q is defined as:

$$q(s_{noisy},s_{clean},b,c)[a_\alpha]=|\{i:s_{clean}[i]= a_\alpha,(s_{noisy}[i-k+1], \ldots ,s_{noisy}[i-1])=b,(s_{noisy}[i+1], s_{noisy}[i+2], \ldots ,s_{noisy}[i+k])=c\}|,$$

where $s_{clean}[i]$ and $s_{noisy}[i]$ denote the symbols at location i in the clean and noisy signals, respectively; and $a_\alpha$ is a symbol in the alphabet A.

The column vector $q(s_{noisy},s_{clean},b,c)$ includes n elements with indices $a_\alpha$ from "$a_1$" to "$a_n$," where n is the size of the symbol alphabet A. Note that the column vector $q(s_{noisy}, s_{clean},b,c)$ is, in general, not obtainable, because the clean signal, upon which the definition depends, is unavailable. Multiplication of the transpose of the column vector $q(s_{noisy}, s_{clean},b,c)$, $q^T(s_{noisy},s_{clean},b,c)$, by the column vector $\lambda_{a_x}$, $\Box \Pi_{a_\alpha}$ produces the sum of the expected distortions in the column vector times the occurrence counts in the row vector that together provide a total expected distortion for replacing "$a_\alpha$" in the metasymbol $ba_\alpha c$ in $s_{noisy}$ by "$a_x$". For example, the first term in the sum is produced by multiplication of the first elements in the row vector by the first element in the column vector, resulting in the first term in the sum being equal to $q^T(s_{noisy}, s_{clean}, b, c)[a_1](p_{a_1 \to a_\alpha} d_{a_1 \to a_x})$ or, in other words, a contribution to the total distortion expected for replacing "$a_\alpha$" by "$a_x$" in all occurrences of $ba_\alpha c$ in $s_{noisy}$ when the corresponding symbol in $s_{clean}$ is $a_1$. The full sum gives the full expected distortion:

$$q^T(s_{noisy}, s_{clean}, b, c)[a_1](p_{a_1 \to a_\alpha} d_{a_1 \to a_x}) +$$
$$q^T(s_{noisy}, s_{clean}, b, c)[a_2](p_{a_2 \to a_\alpha} d_{a_2 \to a_x}) +$$
$$q^T(s_{noisy}, s_{clean}, b, c)[a_3](p_{a_3 \to a_\alpha} d_{a_3 \to a_x}) +$$
$$\vdots$$
$$q^T(s_{noisy}, s_{clean}, b, c)[a_n](p_{a_n \to a_\alpha} d_{a_n \to a_x})$$

As discussed above, DUDE does not have the advantage of knowing the particular clean signal, transmitted through the noise-introducing channel that produced the received noisy signal. Therefore, DUDE estimates the occurrence counts, $q^T(s_{noisy}, s_{clean}, b, c)$, of symbols in the originally transmitted, clean signal, by multiplying the row vector $m^T(s_{noisy}, b, c)$ by $\Pi^{-1}$ from the right. FIG. 9 shows estimation of the counts of the occurrences of symbols "$a_1$"-"$a_n$" for the clean signal.

The resulting expression $$m^T(s_{noisy}, b, c)\Pi^{-1}(\lambda_{a_x} \Box \pi_{a_\alpha})$$

obtained by substituting $m^T(s_{noisy}, b, c)\Pi^{-1}$ for $q^T(s_{noisy}, s_{clean}, b, c)$ represents DUDE's estimation of the distortion, with respect to the originally transmitted clean signal, produced by substituting "$a_x$" for the symbol "$a_\alpha$" within the context [b, c] in the noisy signal $s_{noisy}$. DUDE denoises the noisy signal by replacing "$a_\alpha$" in each occurrence of the metasymbol $ba_\alpha c$ by that symbol "$a_x$" providing the least estimated distortion of the recovered signal with respect to the originally transmitted, clean signal, using the above expression. In other words, for each metasymbol $ba_\alpha c$, DUDE employs the following transfer function to determine how to replace the central symbol $a_\alpha$:

$$g_a^k(b, a_\alpha, c) = \frac{\text{argmin}}{a_x = a_1 \text{ to } a_n}[m^T(s_{noisy}, b, c)\Pi^{-1}(\lambda_{a_x} \Box \pi_{a_\alpha})]$$

In some cases, the minimum distortion is produced by no substitution or, in other words, by the substitution $a_x$ equal to $a_\alpha$.

Figure 10:
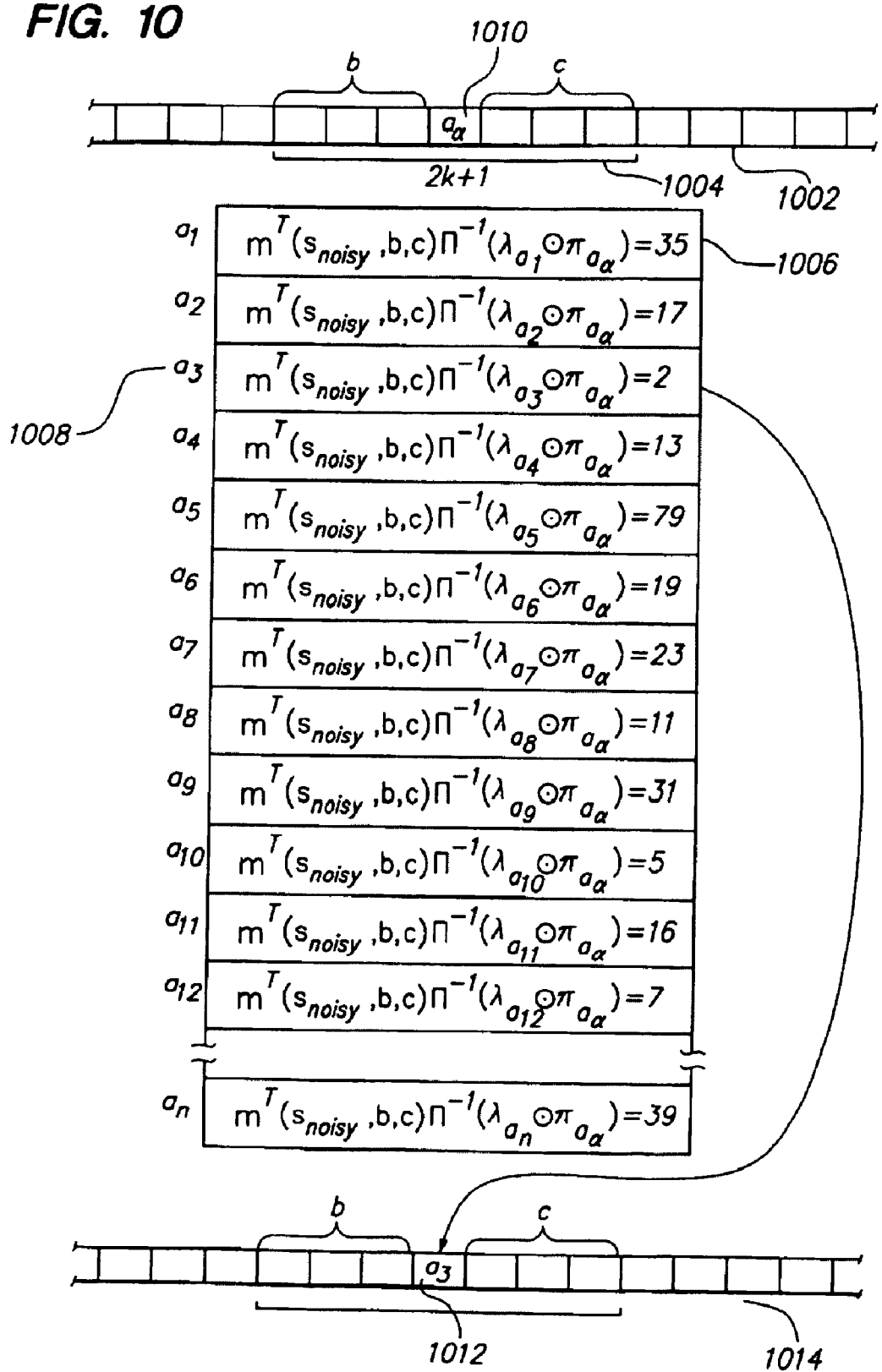
FIG. 10 illustrates the process by which a discrete, universal denoiser denoises a noisy, received signal.

FIG. 10 illustrates the process by which DUDE denoises a noisy, received signal. First, as discussed above, DUDE compiles counts for all or a portion of the possible metasymbols comprising each possible symbol "$a_i$" within each possible context [b, c]. As discussed above, the counts are stored in column vectors $m(s_{noisy}, b, c)$. In the next pass, DUDE again passes a sliding window over the noisy signal 1002. For each metasymbol, such as metasymbol 1004, DUDE determines the relative distortions of the recovered signal with respect to the clean signal that would be produced by substituting for the central character of the metasymbol "$a_\alpha$" each possible replacement symbol "$a_i$" in the range i=1 to n. These relative distortions are shown in table 1006 in FIG. 10 for the metasymbol 1004 detected in the noisy signal 1002. Examining the relative distortion table 1006, DUDE selects the replacement symbol with the lowest relative distortion, or, in the case that two or more symbols produce the same relative distortions, selects the first of the multiple replacement symbols with the lowest estimated distortion. In the example shown in FIG. 10, that symbol is "$a_3$" 1008. DUDE then replaces the central symbol "$a_\alpha$" 1010 in the noisy signal with the selected replacement symbol "$a_3$" 1012 in the recovered signal 1014. Note that the recovered signal is generated from independent considerations of each type of metasymbol in the noisy signal, so that the replacement symbol selected in a previous step does not affect the choice for a replacement symbol in a next step for a different metasymbol. In other words, the replacement signal is generated in parallel, rather than substitution of symbols directly into the noisy signal. As with any general method, the above-described method by which DUDE denoises a noisy signal can be implemented using various data structures, indexing techniques, and algorithms to produce a denoising method that has both linear time and linear working-data-set complexities or, in other words, the time complexity is related to the length of the received, noisy signal, by multiplication by a constant, as is the working-data-set complexity.

The examples employed in the above discussion of DUDE are primarily 1-dimensional signals. However, as also discussed above, 2-dimensional and multi-dimensional signals may also be denoised by DUDE. In the 2-and-multi-dimensional cases, rather than considering symbols within a 1-dimensional context, symbols may be considered within a contextual neighborhood. The pixels adjacent to a currently considered pixel in a 2-dimensional image may together comprise the contextual neighborhood for the currently considered symbol, or, equivalently, the values of a currently considered pixel and adjacent pixels may together comprise a 2-dimensional metasymbol. In a more general treatment, the expression $m^T(s_{noisy}, b, c)\Pi^{-1}(\lambda_{a_x} \Box \Pi_{a_\alpha})$ may be replaced by the more general expression:

$$m^T(s_{noisy}, \eta)\Pi^{-1}(\lambda_{a_x} \Box \pi_{a_\alpha})$$

where $\eta$ denotes the values of a particular contextual neighborhood of symbols. The neighborhood may be arbitrarily defined according to various criteria, including proximity in time, proximity in display or representation, or according to any arbitrary, computable metric, and may have various different types of symmetry. For example, in the above-discussed 1-dimensional-signal examples, symmetric contexts comprising an equal number of symbols k preceding and following a currently considered symbol compose the neighborhood for the currently considered symbol, but, in other cases, a different number of preceding and following symbols may be used for the context, or symbols either only preceding or following a current considered symbol may be used.

Error Correction Coding with DUDE

In an embodiment of the invention, redundancy is added to signal data prior to transmission via a noise-introducing channel. This may be accomplished by using a conventional error correction code (ECC) encoder. Upon reception from the noise-introducing channel, the redundant data is removed and the DUDE method described above is applied to the noisy signal data. The denoised signal data and the redundant data are then provided to a conventional ECC decoder which decodes the data. It is expected that in certain circumstances the performance of a system in which both the DUDE method and ECC are employed will be improved over that of a system that employs only one or the other.

FIG. 11 illustrates a system for denoising and for performing error correction on a signal transmitted through a noise-introducing channel in accordance with an embodiment of the present invention. As before, a clean original signal 1100 is represented as a sequence of symbols that are each members of an alphabet A having n distinct symbols, where A is.

$$A=(a_1,a_2,a_3,\ldots a_n)$$

As shown in FIG. 11, prior to transmission via a noisy channel, the clean signal 1100 is passed through an ECC encoder 1102. The ECC encoder 1102 is a conventional error correction encoder that employs systematic error correction coding. By "systematic," what is meant is that code words generated by the encoder 1100 contain the unmodified symbols of the clean signal in addition to redundant check blocks.

The encoded data signal 1104 is then transmitted via a noise-introducing channel 1106. A noisy encoded data signal 1108 is produced by the noise-introducing channel 1106. This signal 1108 is then applied to a de-multiplexer 1110 which separates the message blocks in each code word from the redundant check blocks which were added by the encoder 1102.

FIG. 12 illustrates operation of the de-multiplexer 1110. As shown in FIG. 12, the noisy encoded signal 1108 includes a sequence of code blocks or words. Each code block includes a portion corresponding to the original message labeled "K" and a redundant portion labeled "M" corresponding to the portion which was added by the encoder 1102. The de-multiplexer 1110 separates the code blocks into the "K" and "M" portions.

Referring to FIGS. 11 and 12, the sequence of "K" portions is included in a noisy message block signal 1112, while the sequence of "M" portions is included in a noisy code block signal 1114. The noisy message block signal 1112 is passed through a denoiser 1116 that performs the DUDE method described herein. The denoiser 1116 produces a less noisy sequence of message blocks 1118. The data signal 1118 corresponds to the original clean signal 1100 after it has been passed through the noise introducing channel 1106 and the denoiser 1116.

The less noisy data signal 1118 and the noisy check blocks 1114 may be recombined by a multiplexer 1120 to produce a less noisy encoded signal 1122. The multiplexer 1120 essentially performs a reverse of the operation performed by the demultiplexer to produce the encoded signal 1122. The encoded signal 1122 corresponds to the encoded data 1104 produced by the encoder 1102 after it has passed through the noise introducing channel 1106 and after the portions of the encoded data that correspond to the original signal have been passed through the denoiser 1116.

The less noisy encoded signal 1122 produced by the multiplexer 1120 is then passed through an appropriate decoder 1124 which uses the redundant data portions of the encoded signal to attempt to correct errors in the message portions. The decoder 1124 performs a decoding operation that is complementary to the encoding operation performed by the encoder 1102. The decoder 1124 produces a decoded data signal 1126. The decoded data signal 1126 is expected to have reduced errors and noise than the less noisy message block signal 1118.

Depending on the rate at which errors are introduced by the noisy channel, certain conventional decoding schemes will decode the message symbols imperfectly to within a certain fidelity. In such circumstances it is expected that use of the DUDE method in conjunction with such a decoding scheme will likely result in greater fidelity in the decoding of the message symbols than use of the decoding scheme by itself.

There need not be a correspondence between the code block size and the amount of data that is operated on by the DUDE method. As shown in FIG. 12, each code block includes a check block M and a corresponding message block K. Because accuracy of the DUDE method is increased when the length of the message is increased, the DUDE method may operate simultaneously on a plurality of the message blocks K. Further, because all such message blocks must be received for the DUDE method to be applied to them, a tradeoff exists between the number of message blocks received before the DUDE method is applied and the time before denoised message symbols become available.

In an embodiment, the DUDE method is applied to a particular metasymbol using count information (from the vector $m(s_{noisy},b,c)$) accumulated for prior metasymbols, but before count information is obtained for later-occurring metasymbols. This embodiment reduces delay for providing each denoised symbol as output while accuracy is lower since not all of the symbols have yet been received and counted. The accuracy should increase, however, as more symbols are received and counted.

Certain conventional decoders accept as input a channel noise level that the decoder uses in the decoding. When such a decoder is used in conjunction with the DUDE method, the DUDE method will tend to reduce the effects of noise in the channel. Thus, the decoding may be improved by estimating for the decoder the reduction in noise attributable to the DUDE method. This information may be used to determine an effective noise level for the channel which can be used by the decoder. For example, assume that the channel has a known noise level expressed as a bit error rate (BER). The amount that the BER is reduced by the DUDE method may be estimated, for example, by experimentation. The amount of reduction in the BER may then be subtracted from the known BER of the channel to provide an effective BER for the channel that takes into account the noise reduction attributable to the DUDE method. The effective BER may then be provided to the decoder for use in the decoding.

As explained herein, the DUDE method depends upon redundancy that is inherent in the original data in order to perform denoising. Thus, where the original data is highly redundant, a system using the DUDE method in conjunction with error correction coding may achieve acceptable performance with low levels of redundancy added through error correction encoding. In other words, the ratio of parity data to message data can be relatively low. However, where the original data has low redundancy levels, overall performance of a system that uses the DUDE method and error correction coding will tend to be improved by increased redundancy added by the error correction coding. In other words, the ratio of parity data to message data may be increased. Thus, in an embodiment, the ratio of parity data to message data is adjusted based on the level of redundancy in the original data.

In another embodiment, systematic fountain codes are used for performing error correction coding in conjunction with the DUDE method. Fountain codes are rateless codes that map k information bits into a semi-infinite information stream. The stream is semi-infinite in that it repeats in a loop. A decoder receives only a random subset of the semi-infinite stream and from that is able to recover the k bits. Thus, the decoder needs to wait only until it has received a sufficient portion of the semi-infinite stream and then it can recover the k message bits. Where a systematic fountain code is used, the DUDE method may be applied to the message portions of the encoded data prior to decoding. It is expected that use of the DUDE method in such circumstances will reduce the amount of data needed to be received before the k message bits can be decoded. This effect of reducing the amount of data needed to be received is expected to be greater where the original data has greater levels of inherent redundancy and less where the original data has lower levels of inherent redundancy.

In some circumstances, use of the DUDE method may not result in effective denoising. This is because performance of the DUDE method depends upon inherent redundancy of the data and thus may not perform well when the inherent redundancy is low. In some circumstances, the DUDE method may even result in deterioration of the data. To address this, in an embodiment, operation of the denoiser may be inhibited.

Figure 13:
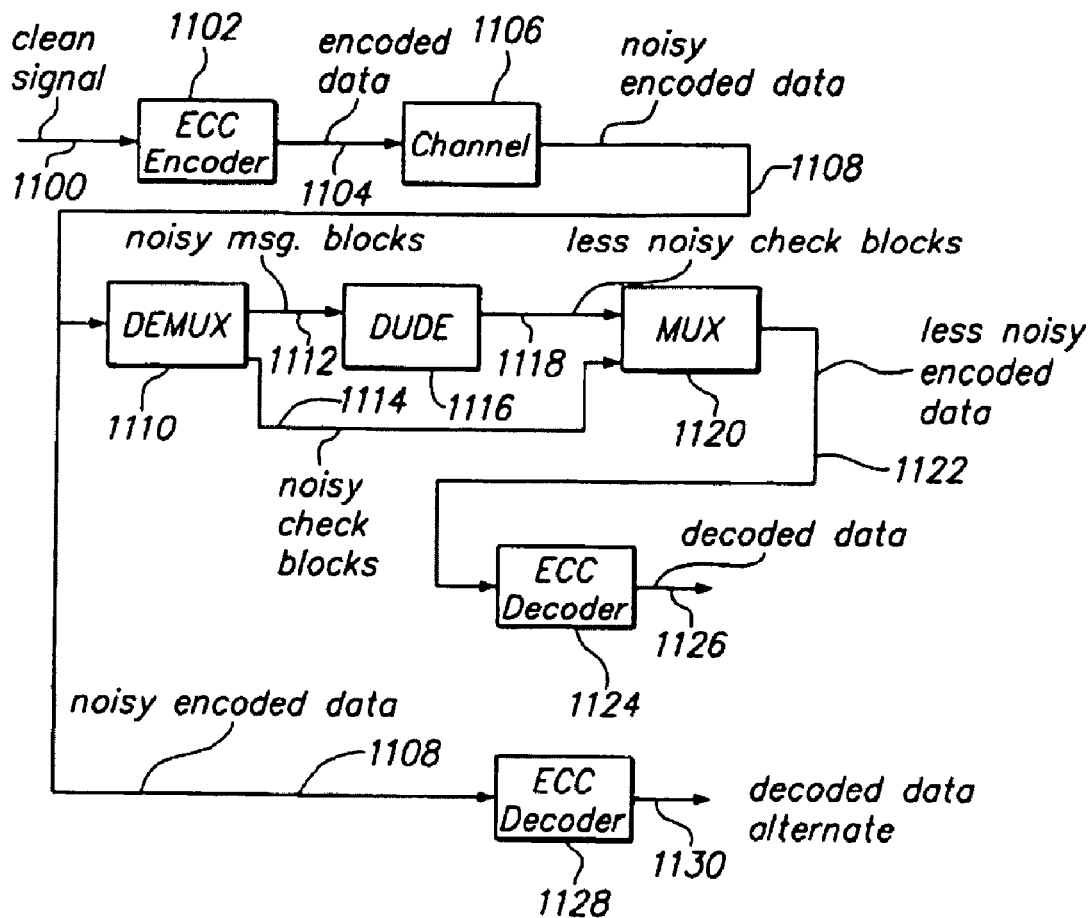
FIG. 13 illustrates a system for denoising and for performing error correction on a signal and having a parallel path for performing error correction on the signal in accordance with an embodiment of the present invention.

FIG. 13 illustrates a system for denoising and for performing error correction on a signal and having a parallel path for performing error correction on the signal in accordance with an embodiment of the present invention. As shown in FIG. 13, parallel paths are provided for the noisy encoded data signal 1108. In a first path, the noisy encoded data signal 1108 passes through the de-multiplexer 1110, denoiser 1116, multiplexer 1120 and decoder 1124 which operate as described above with reference to FIG. 11 to form the decoded data signal 1126. In a second path, the noisy encoded data signal passes through a decoder 1128 which performs error correction decoding in a conventional manner to form a decoded data signal 1130.

In the embodiment of FIG. 13, the decoded data signals 1126 and 1130 may be alternatively selected depending upon which exhibit better performance and is, thus, a more faithful representation of the original clean signal 1100. In an embodiment, one of the signals 1126 and 1130 may be selected over the other based on decoding failures reported by the decoders 1124 and 1126. For example, certain Reed-Solomon error correction schemes provide that in addition to generating a decoded data signal the decoder also generates indications of whether the decoding is successful. Thus, in the embodiment of FIG. 13, the decoders 1124 and 1126 may provide indications of whether the decoding performed by each is successful, which indications may be utilized to determine which of the decoded output signals 1126 or 1130 is to be selected, for example, by comparing the frequency at which each reports decoding failures. One of the signals 1126 and 1130 may be selected by other means. For example, where the signals 1126 and 1130 represent human-perceivable data, such as sound or image data, one of the signals 1126 and 1130 may be selected over the other by a human judging which signal is preferred.

The above-described methods may be performed by hardware, software or any combination thereof. For example, it is known that conventional error correction schemes may be implemented by hardware, software or a combination thereof. Also, the various functional elements shown in FIGS. 11 and 13 may be combined, modified or eliminated and other elements may be added.

DUDE+

As described above with respect to the DUDE method, in a first pass of a sliding window over the noisy signal, counts are compiled for all or a portion of the possible metasymbols where the metasymbols include each symbol "$a_i$" of the alphabet (where i=1 to n) within each context [b, c]. These counts are used to generate the column vectors $m(s_{noisy}, b, c)$ shown in FIG. 4. In a second pass of the sliding window, for each metasymbol encountered in the noisy signal, DUDE computes estimates of the distortions with respect to the clean signal that would be produced by exchanging the central symbol "$a_\alpha$" of the metasymbol with each possible replacement symbol "$a_i$" in the range i=1 to n. DUDE then selects the symbols to minimize the estimated distortion. Thus, the output of the DUDE method is a sequence of symbols, as shown in FIG. 1.

Figure 14:
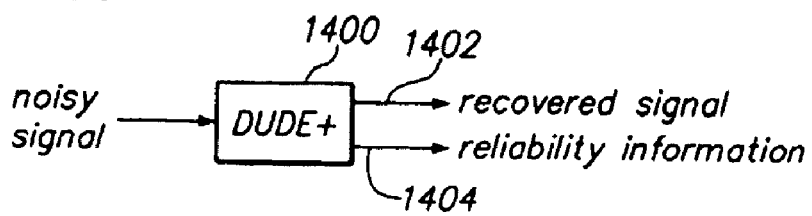
FIG. 14 illustrates a system in accordance with an embodiment of the present invention for generating a recovered, less-noisy signal and for generating reliability information.

In an embodiment, referred to herein as "DUDE+", the DUDE method is modified to generate reliability information regarding the symbols in the noisy signal. The reliability information quantitatively represents the belief of the algorithm in the likelihood of the values of the unknown clean signal. FIG. 14 illustrates a system 1400 in accordance with an embodiment of the present invention for generating a recovered, less-noisy signal 1402 and for generating reliability information 1404. In an embodiment, the system 1400 implements the DUDE+ method and generates one or both of the recovered signal 1402 and/or the reliability information 1404. In an embodiment, the reliability information is provided in machine-readable form which may be used for further processing.

Instead of, or in addition to, selecting substitute symbols for inclusion in the recovered signal as in DUDE, DUDE+ does the following: for each metasymbol encountered in the second pass, DUDE+ computes an estimate of the probability that the value in the clean signal that corresponds to the position of the central symbol "$a_\alpha$" of the metasymbol of the noisy signal assumed a particular symbol value, with an estimated probability being computed for each possible symbol "$a_i$" in the alphabet.

For example, for a particular metasymbol [b, $a_3$, c] encountered in the noisy output signal, DUDE+ generates as an output reliability information in the form of: an estimate of the probability that the value in the clean signal that corresponds to the received central symbol $a_3$ was in fact the symbol $a_1$ (e.g., 0.28%); an estimate of the probability that the value in the clean signal corresponding to the central symbol $a_3$ was in fact the symbol $a_2$ (e.g., 1.9%); an estimate of the probability that the value in the clean signal corresponding to the central symbol in the received signal was in fact the symbol $a_3$ (e.g., 80%); and so forth for each symbol in the alphabet. Thus, for each metasymbol occurring in the noisy signal, an estimated probability is determined for each possible value of the clean symbol corresponding to the central symbol of the metasymbol. This estimated probability represents the probability that the value in the clean signal corresponding to the central symbol of the metasymbol assumed each of the possible values. A set (a vector) of n estimated probabilities is generated for each metasymbol encountered in the noisy signal. The sum of the estimated probabilities for each metasymbol is one (i.e. 100%). Because the set of probabilities depends on the particular metasymbol (including its central symbol), the same set of probabilities is generated for each unique metasymbol.

To compute these estimates of the probabilities, an estimated conditional distribution may first be computed in accordance with the following expression:

$$(m^T(s_{noisy}, b, c)\Pi^{-1})[a_x]\Pi(a_x, a_\alpha) \text{ with } x=1, 2, \ldots, n$$

where (v)[x] denotes the x-th component of a vector v. $\Pi(a_x, a_\alpha)$ is also denoted herein as $p_{a_x \to a_\alpha}$ which is the probability that symbol $a_x$ will be transmitted by the noise-introducing channel as $a_\alpha$. The estimated conditional distribution for a particular metasymbol includes an estimate of the number of times a particular metasymbol occurs in the clean signal where the noisy channel has caused the central symbol to be unchanged and also includes a set of values which represent an estimate of the number of times the central symbol has been changed from a particular other one of the symbols of the alphabet.

The above expression is applicable to one-dimensional signals in which the context [b, c] represents symbols appearing before or after a particular symbol. More generally, reliability information may be computed for other context types, such as two-dimensional image data. An estimated conditional distribution for the more general case may thus be computed in accordance with the following expression:

$$(m^T(s_{noisy},\eta)\Pi^{-1})[a_x]\Pi(a_x,a_\alpha) \text{ with } x=1, 2, \ldots, n$$

where η denotes the values of a particular contextual neighborhood of symbols.

FIG. 15 illustrates an estimated conditional distribution and probabilities for an exemplary metasymbol in a noisy received signal in accordance with an embodiment of the present invention. As shown in FIG. 15, the conditional distribution is computed for an exemplary metasymbol [b, $a_3$, c] which includes the symbol $a_3$ in a context [b, c]. The conditional distribution includes a value corresponding to each symbol in the alphabet of n symbols. Accordingly, the distribution includes n terms. The conditional distribution may be converted to conditional probabilities by dividing each term by the total of the terms, where the total is the sum over x. As shown in FIG. 15, the conditional probabilities are represented as percentages, but may also be represented as fractions. Both the conditional distribution and the conditional probabilities are referred to herein as reliability information.

FIG. 15 shows reliability information as a list or distribution including n values for a particular metasymbol encountered in the noisy signal. It will be apparent that the reliability information for the collection of metasymbols that occur in the noisy signal may be presented in multiple different ways. In a first example, the reliability information may be output from the DUDE+ method as a sequence of lists, each list being correlated to a particular symbol in the noisy signal. In this case, there is a one-to-one correspondence between lists being output and symbols occurring in the noisy signal. Thus, when a metasymbol is repeated in the noisy signal, the corresponding list is also repeated. Accordingly, where the signal is N symbols long, N reliability information lists are output by the DUDE+ method. In a second example, the reliability information may be output from the DUDE+ method as a collection of such lists, including one list for each metasymbol occurring in the noisy signal. In this case, the reliability information lists are not correlated in time or sequence to the particular symbols that occur in the noisy signal. Thus, the reliability information for a particular metasymbol is not repeated even though the particular metasymbol occurs many times in the noisy signal. Accordingly, where there are M unique metasymbols in the noisy signal, M reliability information lists are output by the DUDE+ method.

Error Correction Coding with DUDE+

As described above, the DUDE+ method generates reliability information instead of, or in addition to, the less noisy sequence of symbols. Certain conventional error correction coding schemes may accept the reliability information for performing error correction. For example, channel decoding algorithms based on the Viterbi algorithm, backward-forward dynamic programming BCJR, turbo coding and belief propagation algorithms may each accept reliability information as input. Decoders that implement such methods that accept reliability information as input are known as soft-input decoders.

In an embodiment of the invention, redundancy is added to signal data prior to transmission via a noise-introducing channel. This may be accomplished by using a conventional error correction code (ECC) encoder. Upon reception from the noise-introducing channel, the redundant data is removed from the noisy encoded signal data and the DUDE+ method described above is applied to the noisy signal data to generate reliability information. The reliability information and the noisy redundant data are then provided to a conventional soft-input decoder which decodes the data. It is expected that in certain circumstances the performance of a system in which both the DUDE+ method and ECC are employed will be improved over that of a system that employs only ECC.

Figure 16:
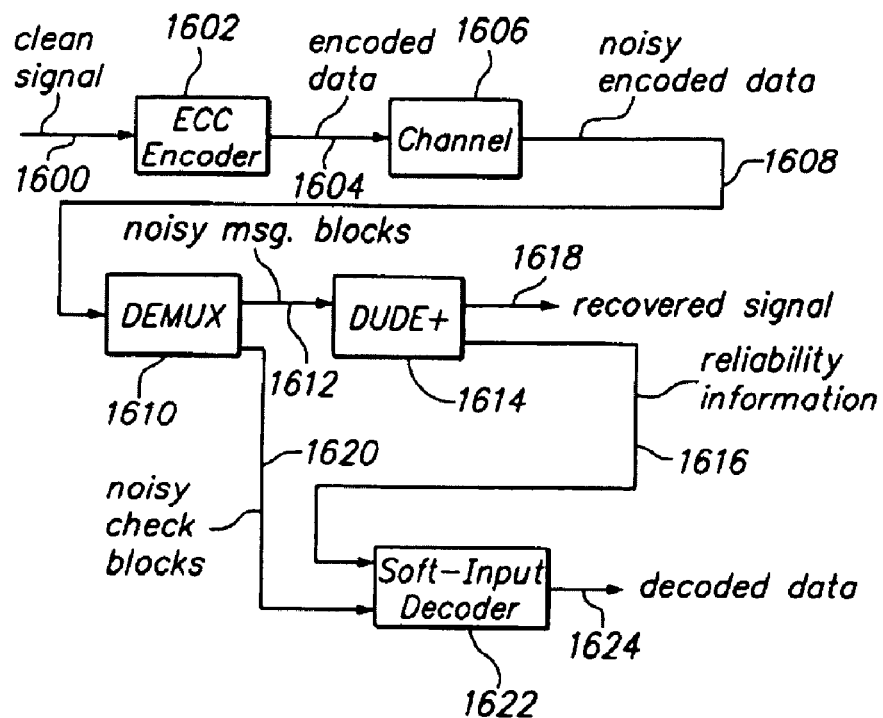
FIG. 16 illustrates a system for generating reliability information and for performing error correction on a signal in accordance with an embodiment of the present invention.

FIG. 16 illustrates a system for generating reliability information and for performing error correction on a signal in accordance with an embodiment of the present invention. As before, a clean original signal 1600 is represented as a sequence of symbols that are each members of an alphabet A having n distinct symbols, where A is:

$$A=(a_1,a_2,a_3,\ldots a_n)$$

As shown in FIG. 16, prior to transmission via a noisy channel, the clean signal 1600 is passed through an ECC encoder 1602. The ECC encoder 1602 is a conventional error correction encoder that employs systematic error correction coding to generate an encoded data signal 1604. The encoded data signal 1604 is then transmitted via a noise-introducing channel 1606. A noisy encoded data signal 1608 is produced by the noise-introducing channel 1606. This signal 1608 is then applied to a de-multiplexer 1610 which separates the message blocks in each code word from the redundant check blocks which were added by the encoder 1602.

A noisy message block signal 1612 from the de-multiplexer 1610 is passed through a denoiser 1614 that performs the DUDE+ method described herein. The denoiser 1614 produces reliability information 1616. The denoiser 1614 may also produce a less noisy sequence of message blocks 1618. The data signal 1618 corresponds to the original clean signal 1600 after it has been passed through the noise introducing channel 1606 and the denoiser 1614. In an embodiment, this signal 1618 is not needed and, thus, need not be generated. For example, where the reliability information 1616 is output as a sequence of lists, each list being correlated to a particular symbol in the noisy signal, the noisy encoded data 1608, the noisy symbols 1612 or the less-noisy symbols 1618 need not be provided to the decoder 1622. This is shown in FIG. 16. However, in an embodiment where the reliability information is output as lists that are not correlated in time or sequence to the particular symbols that occur in the noisy signal, then the noisy encoded data 1608, the noisy message symbols 1612 or the recovered signal 1618 may be provided to the decoder 1622 with appropriate modifications to the system of FIG. 16. In any case, the noisy check blocks 1620 are provided to the decoder 1622 though they may be included in the noisy encoded data 1608.

The noisy check blocks 1620 from the de-multiplexer 1610 are then passed to an appropriate soft-input decoder 1622 which uses the reliability information 1616 from the denoiser 1614 and the redundant data introduced by the encoder 1602 to perform error correction. The decoder 1622 produces a decoded data signal 1624. The decoded data signal 1624 is expected to have reduced errors and noise compared to the noisy message block signal 1612.

Depending on the rate at which errors are introduced by the noisy channel, certain conventional soft-input decoding schemes will decode the message symbols imperfectly to within a certain fidelity. In such circumstances, it is expected that use of the DUDE+ method in conjunction with such a decoding scheme will likely result in greater fidelity in the decoding of the message symbols than use of the decoding scheme by itself.

In some circumstances, the values determined by the DUDE+ method for the conditional probabilities not be between zero and one, which can cause difficulties for the decoder 1622 since most conventional soft-input decoders expect these values to be between zero and one. For example, the actual values may be negative, zero or one. To avoid this, the values computed according to:

$$(m^T(s_{noisy},b,c)\Pi^{-1})[a_x]\Pi(a_x,a_\alpha) \text{ with } x=1,2,\ldots,n$$

are preferably adjusted to be within the range of zero to one. In an embodiment for a binary alphabet, this may be accomplished by the following pseudocode:
(1) total=$1^T m(s_{noisy},b,c)$
(2) c=0.25
(3) rdr=$(m^T(s_{noisy},b,c)\Pi^{-1})[1]$/total
(4) rnr=$(m^T(s_{noisy},b,c)\Pi^{-1})[0]$/total
(5) if (rnr<=0) rnr=0
(6) if (rdr<=0) rdr=0
(7) temp=min(rnr,rdr)
(8) temp=min(temp+c/sqrt(total),0.5)
(9) if(rnr<rdr) rnr=temp; else rnr=1−temp
(10) rdr=1−rnr In line (1) above, $1^T=[1\ 1\ 1\ \ldots\ 1]$ is the all ones vector so that a variable, total, is set equal to the sum of the components of $m(s_{noisy},b,c)$. In line (2), a variable, c, is set equal to 0.25, though a different value may be selected. In line (3), a variable rdr set equal to the first vector component of $(m^T(s_{noisy},b,c)\Pi^{-1})[a_x]$ divided by the variable, total. In line (4), a variable rnr is set equal the zero vector component of $(m^T(s_{noisy},b,c)\Pi^{-1})[a_x]$ divided by the variable total. In line (5), the value of rnr is compared to zero and if it is less than zero, the value of rnr is set to zero. Similarly, in line (6), the value of rdr is compared to zero and if it is less than zero, the value of rdr is set to zero. The values rdr and rnr are, thus, fractions that are expected to be between zero and one and that are expected to be equal to one when summed together. However, if either of rnr or rdr is negative, it is set equal to zero. In line (7) and (8), a variable, temp, is set equal to the smaller of rnr and rdr plus a perturbation, but without allowing temp to exceed 0.5. In lines (9) and (10), the smaller of rnr and rdr is set equal to temp and the other is set equal to 1−temp.

Then, using the resulting values of rnr and rdr, the reliability information is as follows: (rdr)$\Pi(1, a_\alpha)$ and (rnr)$\Pi(0, a_\alpha)$ for the context b,c and central symbol $a_\alpha$.

In another embodiment for a binary alphabet, the conditional probabilities may be adjusted to be within the range of zero to one by the following pseudocode:
(1) total=$1^T m(s_{noisy},b,c)$
(2) rnr=$(m^T(s_{noisy},b,c)\Pi^{-1})[0]$/total
(3) temp=1/total;
(4) temp=min(temp,0.5);
(5) if (rnr<temp) rnr=temp; else if (rnr>1−temp) rnr=1−temp
(6) rdr=1−rnr In line (1) above, $1^T=[1\ 1\ 1\ \ldots\ 1]$ is the all ones vector so that a variable, total, is set equal to the sum of the components of $m(s_{noisy},b,c)$. In line (2), a variable rnr set equal to the zero vector component of $(m^T(s_{noisy},b,c)\Pi^{-1})[a_x]$ divided by the variable, total. In line (3), a variable temp is set equal to the inverse of total. In line (4), the variable temp is set equal to its former value or 0.5 whichever is less. In line (5), if rnr is less than temp, it is set equal to temp; otherwise, if rnr is greater than 1−temp, rnr is set equal to 1−temp. In line (6), rdr is set equal to 1−rnr. As before, using the resulting values of rnr and rdr, the reliability information is as follows: (rdr)$\Pi(1, a_\alpha)$ and (rnr)$\Pi(0, a_\alpha)$ for the context b,c and central symbol $a_\alpha$.

It will be apparent that other techniques can be performed to adjust the reliability information to be within a specified range of values and that techniques can also be performed to adjust the reliability information to be within a specified range for data signals having larger alphabets than in the examples above.

As is the case for the DUDE method, there need not be a correspondence between the code block size and the amount of data that is operated on by the DUDE+ method. Because accuracy of the DUDE+ method is increased when the length of the message is increased, the DUDE+ method may operate simultaneously on a plurality of message blocks K (where an error correction coding algorithm assigns a check block M to each message block K for decoding). Thus, a tradeoff exists between the number of message blocks received before the DUDE+ method is applied and the time before denoised message symbols become available.

Also, in an embodiment, the DUDE+ method may be applied to a particular metasymbol using count information accumulated for prior metasymbols to produce reliability information for the metasymbol, but without using the count information from later-occurring metasymbols. This embodiment reduces delay for providing each denoised symbol as output while accuracy is lower since not all of the symbols have yet been received and counted. However, accuracy is expected to increase as more symbols are received and counted.

As is also the case for the DUDE method, the DUDE+ method depends upon redundancy that is inherent in the original data in order to perform its denoising. Thus, where the original data is highly redundant, a system using the DUDE+ method in conjunction with error correction coding may achieve acceptable performance with low levels of redundancy added through error correction encoding. However, where the original data has low redundancy levels, overall performance of a system that uses the DUDE+ method and error correction coding will tend to be improved by increased redundancy in the error correction coding. Thus, in an embodiment, the ratio of parity data to message data is adjusted based on the level of redundancy in the original data.

Systematic fountain codes may be used for performing error correction coding in conjunction with the DUDE+ method. Where a systematic fountain code is used, it is expected that use of the DUDE+ method will reduce the amount of data needed to be received before k information message bits can be decoded. This effect of reducing the amount of data needed to be received is expected to be greater where the original data has greater levels of inherent redundancy and less where the original data has lower levels of inherent redundancy.

In some circumstances, use of the DUDE+ method may not result in effective denoising. This is because performance of the DUDE+ method depends upon inherent redundancy of the data. In some circumstances, the DUDE+ method may even result in deterioration of the data. To address this, in an embodiment, operation of the denoiser may be inhibited.

Figure 17:
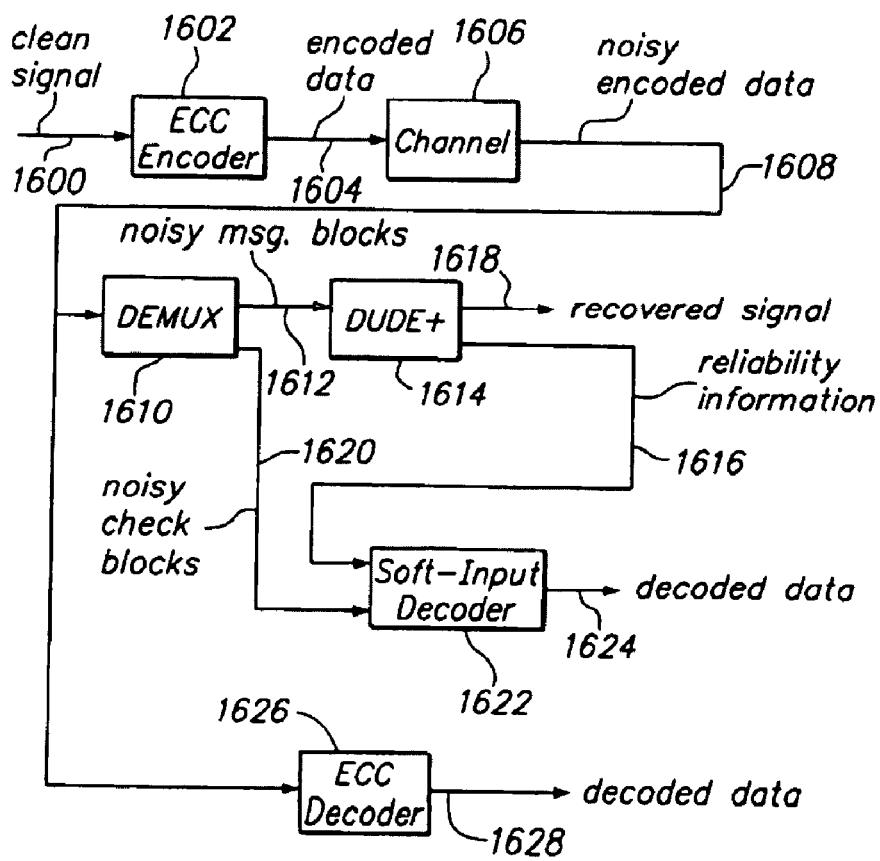
FIG. 17 illustrates a system for generating reliability information and for performing error correction on a signal and having a parallel path for performing error correction on the signal in accordance with an embodiment of the present invention.

FIG. 17 illustrates a system for denoising and for performing error correction on a signal and having a parallel path for performing error correction on the signal in accordance with an embodiment of the present invention. As shown in FIG. 17, parallel paths are provided for the noisy encoded data signal 1608. In a first path, the noisy encoded data signal 1608 passes through the de-multiplexer 1610, denoiser 1614 and decoder 1622 which operate as described above with reference to FIG. 16 to form the decoded data signal 1624. In a second path, the noisy encoded data signal passes through a decoder 1626 which performs error correction decoding in a conventional manner to form a decoded data signal 1628.

Similarly to the embodiment of FIG. 13, in the embodiment of FIG. 17, the decoded data signals 1624 and 1628 may be alternatively selected depending upon which exhibit better performance and is, thus, a more faithful representation of the original clean signal 1600. Also, similarly to the embodiment of FIG. 16, in the embodiment of FIG. 17, the signals 1608, 1612 or 1618 may be provided to the decoder 1622, depending on the format of the reliability information 1616.

The above-described methods may be performed by hardware, software or any combination thereof. For example, it is known that conventional error correction schemes may be implemented by hardware, software or a combination thereof. Also, the various functional elements shown in FIGS. 16 and 17 may be combined, modified or eliminated and other elements may be added. For example, the decoder 1622 may receive the noisy encoded data 1608 for performing error correction, in which case the decoder 1622 may receive the signal 1608 rather than the signal 1620.

DUDE++

In certain circumstances, the components of an underlying noise-free clean signal are finite valued, yet their noisy observations take values in a continuous alphabet, such as the real numbers or vectors of real numbers. As before, the alphabet A of the noise-free signal can be expressed as;

$$A=(a_1,a_2,a_3,\ldots a_n)$$

where the size of the alphabet n is finite. However, the alphabet R of the noisy signal output from the channel is not so limited. Thus, the output signal can include members of a general, possibly continuous alphabet.

The DUDE and DUDE+ denoising approaches described above are based on accumulating counts of occurrences of contextual neighborhoods of symbols appearing in the noisy observation signal in a first pass. A metasymbol represents a particular symbol within a context of other symbols. For simplicity of explanation, the description of the DUDE++ approach herein is directed primarily to one-dimensional signals where the context of a given symbol is composed of k symbols occurring to the right and to the left of the symbol and, thus, the neighborhood or metasymbol is a string of length 2k+1. It will be apparent that the techniques described herein can be applied to multi-dimensional signals, such as images, and that contexts can be composed of arbitrary neighborhoods or groupings of symbols.

In a second pass of the DUDE approach, for each particular symbol encountered within a particular context, the symbol is replaced based on whether the replacement is estimated to result in the least overall distortion relative to the input signal. In a second pass of the DUDE+ approach, for each metasymbol encountered, an estimate of the probability that the value in the input signal that corresponds to the position of the central symbol "$a_\alpha$" of the metasymbol of the noisy signal assumed a particular symbol value is computed, with an estimated probability being computed for each possible symbol "$a_i$" in the input (clean) alphabet. The estimated probabilities are 'soft' information which may be expressed as a conditional distribution or as conditional probabilities, which are collectively referred to herein as reliability information.

Where the output signal includes members of the general, possibly continuous alphabet, each metasymbol appearing in the output signal can be distinct. Thus, an approach uses a processed version of the observed noisy signal to estimate the distribution of 2k+1 metasymbols in the input signal in a first pass. The distribution of the input signal is estimated based on quantizing the observed noisy signal. This can be done with any quantizer having the property that the induced channel matrix Π is invertible. Here, the channel matrix Π can be expressed as a two-dimensional matrix with the matrix element identified by indices (i, j) indicating the probability that symbol "$a_i$" in the input signal will be observed as symbol "$a_j$" in the quantized observation signal received from the noise-introducing channel. This assumes, for simplicity, that the quantizer output takes values in the finite input signal alphabet.

Thus, when employed on the quantized signal, the first pass is similar to that of the DUDE and DUDE+ approaches described herein in that counts of occurrences of strings (i.e. metasymbols) of length 2k+1 appearing in the noisy quantized signal are accumulated. In a second pass, the input symbol at each location may be estimated based on the 2k+1 noisy components around it, assuming the estimated input distribution similar to the DUDE approach described herein. Further, in the second pass, estimates of the conditional probability that the value in the input signal that corresponds to the position of the central symbol of the metasymbol of the noisy signal assumed a particular symbol value may be computed, similarly to the DUDE+ approach. These estimates of probabilities are referred to herein as reliability information. In a preferred embodiment, measures are taken to restore channel probability density information lost through quantization of the noisy observation signal.

Figure 18:
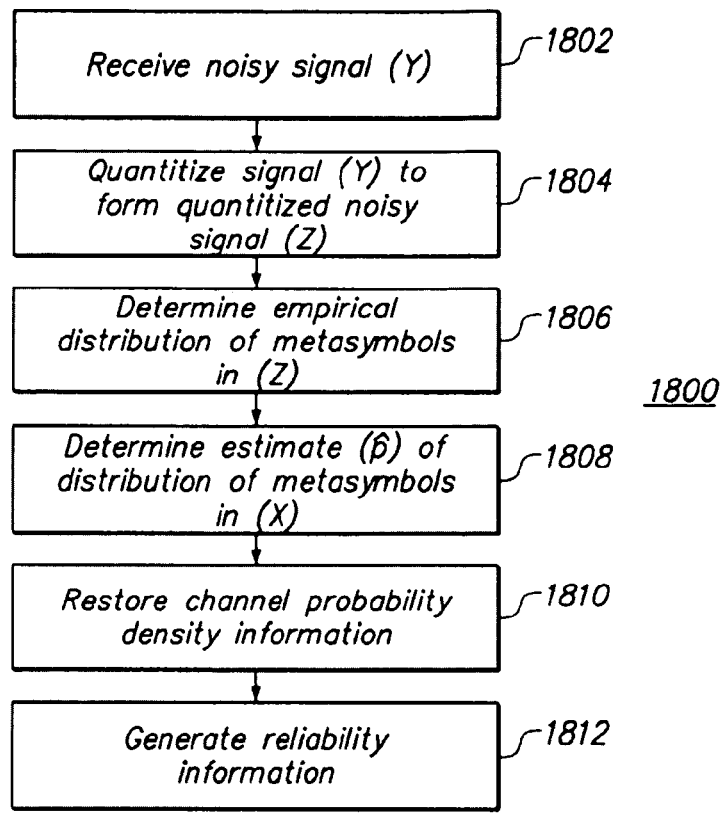
FIG. 18 illustrates a quantizer for converting a general noisy signal to a finite noisy signal in accordance with an embodiment of the present invention.
Figure 19:
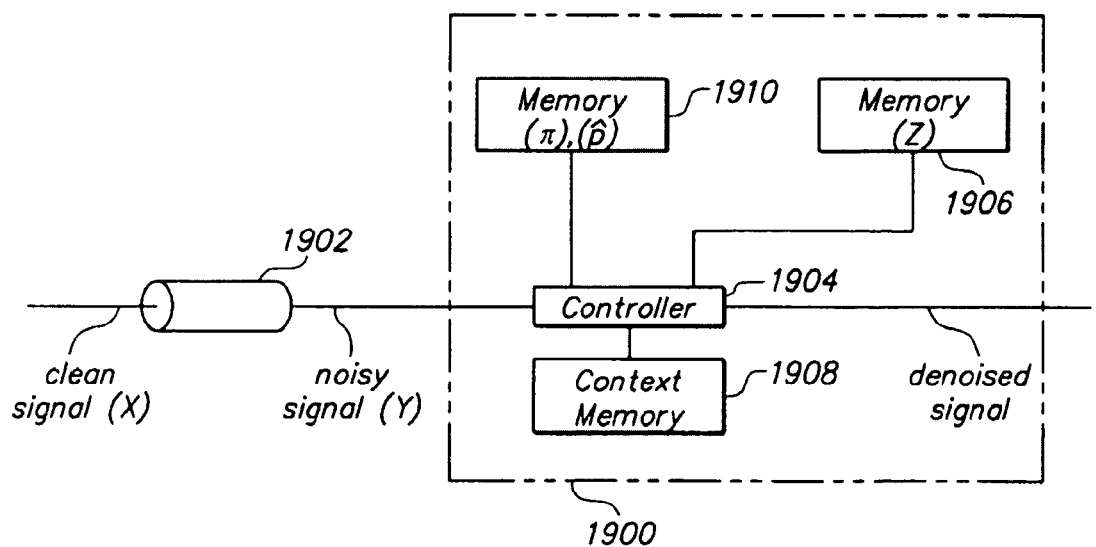
FIG. 19 illustrates a system in accordance with an embodiment of the present invention for generating a recovered, less-noisy signal from a finite input, general output channel and for generating reliability information in accordance with an embodiment of the present invention.

FIG. 18 illustrates a method 1800 of denoising a signal received from a finite input, general output channel in accordance with an embodiment of the present invention. FIG. 19 illustrates a system 1900 in accordance with an embodiment of the present invention for generating a recovered, less-noisy signal from a finite input, general output channel and for generating reliability information in accordance with an embodiment of the present invention. The system 1900 may be used to implement the method 1800.

A clean signal X=($X_1, X_2, X_3, \ldots$) is applied to a noise-introducing channel 1902 (FIG. 19) to produce a noisy signal Y where the noisy signal Y includes a received sequence of symbols Y ($Y_1, Y_2, Y_3, \ldots$). In step 1802 (FIG. 18), the noisy signal Y is received.

Figure 20:
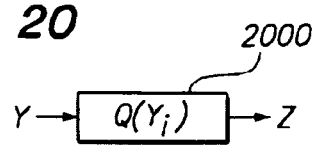
FIG. 20 illustrates a method of denoising a signal received from a finite input, general output channel in accordance with an embodiment of the present invention.

In step 1804, quantization is performed on the received sequence to form a quantized version of the received sequence given by Z=($Z_1, Z_2, Z_3, \ldots$). The function performed by the quantizer may be given as $Z_i=Q(Y_i)$. FIG. 20 illustrates a quantizer 2000 for converting a general noisy signal Y to a finite alphabet noisy signal Z in accordance with an embodiment of the present invention.

The quantizer 2000 essentially maps the set of received symbols Y to a finite set of symbols, with some loss of information. The quantizer may be implemented by the controller 1904 of FIG. 19. The controller 1904 may then store the quantized sequence of symbols Z in a memory 1906.

The matrix Π (i, j) denotes the symbol-transition probability matrix for the channel, with a matrix element identified by indices (i, j) indicating the probability that symbol "$a_i$" will be transmitted as symbol "$a_j$" in the quantized observation signal received from the noise-introducing channel. The matrix Π is induced by quantizing the noisy sequence of symbols with the quantizer:

$$\Pi(i,j)=\int_{y:Q(y)=j} f_i(y)dy,$$

where $\theta_i(y)$ denotes the conditional probability density of the real valued channel output when the channel input is "$a_i$".

The quantizer should be selected so that the above equation results in the matrix Π being invertible. It is assumed that the quantizer has this property. For example, where the input sequence X is binary, such that each symbol in the input sequence X is either one or minus one, and the channel is an additive white Gaussian noise channel (or other additive noise channel with a symmetrical about zero noise distribution), a suitable quantizer may be given as:

$$Q(Y_i) = \begin{cases} 1 & \text{for } Y_i \geq 0 \\ -1 & \text{otherwise} \end{cases}$$

The resulting matrix Π will be symmetric and invertible.

In step 1806, an empirical distribution of metasymbols of length 2k+1 is determined from the quantized sequence of symbols (Z). The empirical distribution is arranged to form a column vector $\vec{r}$ in such a way that the i-th component of $\vec{r}$ is the empirical frequency of the i-th string in a lexicographic ordering of the strings of length 2k+1 over the quantizer output alphabet, which is assumed to be in the order $a_1, a_2, \ldots, a_n$. The entry of $\vec{r}$ corresponding to a string $z_1, z_2, \ldots, z_{2k+1}$ may also be given as:

$$\vec{r}[z_1, z_2, \ldots, z_{2k+1}]$$

The empirical distribution may be stored in a memory 1908 (FIG. 19).

In step 1808, an estimate of the distribution of metasymbols in the input signal is determined. This may be computed using the expression:

$$\hat{p} = [(\Pi_{2k+1})^{-1}]^T \cdot \vec{r},$$

where $\Pi_{2k+1}$ denotes the 2k+1-th fold tensor product of Π with itself and represents a 2k+1 block or metasymbol channel probability matrix. The multiplication by the inverse may be implemented using well known fast techniques for multiplication by matrices formed as tensor products of smaller matrices. Note that in this case the inverse of $\Pi_{2k+1}$ is itself a 2k+1-th fold tensor product of $\Pi^{-1}$.

Thus, in step 1808, the empirical distribution vector determined from the quantized observed output symbols $\vec{r}$ is multiplied by the inverse of the 2k+1 metasymbol channel probability matrix $\Pi_{2k+1}$ to obtain an estimate $\hat{p}$ of the distribution of metasymbols of length 2k+1 in the clean input signal X. The correspondence between entries of $\hat{p}$ and strings over the alphabet $a_1, a_2, \ldots, a_n$ is the same as above for the vector $\vec{r}$. The matrix Π and/or its inverse transform may be stored in memory 1910 (FIG. 19). The estimate $\hat{p}$ of distributions of metasymbols may also be stored in the memory 1910.

A second pass is then performed. In step 1810, channel probability density information lost through the quantization step 1804 is preferably restored. This may be accomplished by multiplying the estimate $\hat{p}$ by the channel probability density evaluated at the channel output values that were actually observed:

$$\hat{p}(x_{i-k}^{i+k}, z_{i-k}^{i+k}) = \hat{p}[x_{i-k}^{i+k}] \cdot \prod_{j=i-k}^{i-k} f_{x_i}(z_j)$$

The result represents an estimate of the joint probability distribution of 2k+1 tuples of original and noisy symbols.

In step 1812, reliability information is generated. This is may be accomplished by summing the joint probability distribution over all the values that the context symbols can possibly take on to determine their contributions:

$$\hat{p}(x_i \mid z_{i-k}^{i+k}) \propto \sum_{x_{i-k}^{i-1}, x_{i+1}^{i+k}} \hat{p}(x_{i-k}^{i+k}, z_{i-k}^{i+k})$$

This has the effect of marginalizing the context symbols in each metasymbol, resulting, after normalization $$\left(\text{so that } \sum_{x_1} \hat{p}(x_1 \mid z_{i-k}^{i+k}) \text{ is } 1\right),$$

in a conditional probability distribution on the i-th input symbol given its corresponding noisy metasymbol. This computation is repeated for each index i to generate a sequence of conditional probability (reliability) estimates. The resulting reliability information is the output of step 1812 in FIG. 18. The resulting reliability estimates may then be stored in memory 1906. As in the DUDE+ approach, the reliability information may be presented in multiple different ways. For example, the reliability information may be presented as plurality of lists, which may or may not be correlated in time or sequence to the particular symbols that occur in the quantized noisy signal (Z).

Step 1810 may be omitted. In this case, information lost due to the quantization step 1804 is not taken into account. However, in the preferred method, the step 1810 is performed to take into account information loss due to quantization.

If desired, the reliability estimates obtained from the noisy signal may then be used to generate a recovered signal. In this case, for each metasymbol, the relative distortions are determined of the recovered signal with respect to the input signal that would be produced by substituting for the central symbol of the metasymbol each possible replacement symbol "$a_i$" in the range i=1 to n. This step may make use of the symbol-transformation distortion matrix Λ. The replacement symbol with the lowest estimated relative distortion is selected and inserted into the recovered signal. The recovered signal is generated from independent considerations of each type of metasymbol in the noisy signal If step 1810 is omitted, then the reliability information may be generated in accordance with the DUDE+ method described above, using the quantized noisy signal generated in step 1804. In this case, for each metasymbol encountered in the second pass, an estimate of the probability that the value in the clean signal that corresponds to the position of the central symbol "$a_\alpha$" of the metasymbol of the noisy signal assumed a particular symbol value, with an estimated probability being computed for each possible symbol "$a_i$" in the alphabet.

To compute these estimates of the probabilities, an estimated conditional distribution may be computed in accordance with the following expression:

$$(m^T(Z,\eta)\Pi^{-1})[a_x])\Pi(a_x, a_\alpha) \text{ with } x=1,2,\ldots,n$$

where η denotes the values of a particular contextual neighborhood of symbols in the quantized noisy signal Z (in the one-dimensional signals discussed above, η corresponds to the values of the k long left and right contexts). The vector m is defined as in the DUDE and DUDE+ descriptions and thus represents counts of occurrences of symbols within a particular context determined from the quantized signal. As before, the conditional distribution may be converted to conditional probabilities by dividing each term by the total of the terms, where the total is the sum over x.

The above approach for denoising for a finite input, general output channel is described in Dembo and Weissman, "Universal denoising for the finite-input general-output channel," IEEE Transactions on Information Theory, pp. 1507-1516, Vol. 51, No. 4. April 2005, the entire contents of which are hereby incorporated by reference.

Error Correction Coding with DUDE++

As described above, the DUDE+ method generates reliability information instead of, or in addition to, the less noisy sequence of symbols. Certain conventional error correction coding schemes may accept the reliability information for performing error correction. In addition, certain conventional error correction coding schemes may provide enhanced reliability information as an output. Decoders that implement such methods that accept reliability information as input and that generate reliability information are known as soft-input, soft-output (SISO) decoders. The belief propagation algorithm for decoding low density parity check (LDPC) codes and the iterative turbo decoding algorithm for decoding turbo codes are examples of SISO decoding algorithms In an embodiment of the invention, redundancy is added to signal data prior to transmission via a noise-introducing channel. This may be accomplished by using a conventional error correction code (ECC) encoder in a preliminary signal processing system stage. Upon reception from the noise-introducing channel, the redundant data is removed from the noisy encoded signal data and a denoiser that implements the DUDE+ method described above operates on the noisy signal data to generate reliability information. The reliability information and the noisy redundant data are then provided to a conventional SISO decoder which generates enhanced reliability (i.e. probabilistic) information. This probabilistic information is expected to assume values in a real vector space, or simply the set of real numbers if the probabilistic information is expressed as likelihood ratios in the case of a binary input alphabet.

This probabilistic information may then be input to a subsequent signal processing system stage having a denoiser that implements the DUDE++ method Q described above to generate further enhanced probabilistic information. Thus, the input to this stage is treated as the noisy signal by the denoiser that implements the DUDE++ method. Error correction may also be performed in this subsequent stage on the further enhanced probabilistic information by a second SISO error correction decoder. The conditional probability sequence output of this subsequent stage may again be input to another subsequent stage system that implements the DUDE++ method described above and that possibly implements error correction, to generate still further enhanced probabilistic information. This process may be repeated recursively. Enhanced probabilistic information may then be converted into a recovered signal which is an estimate of the input signal before it passed through a noisy channel. This can be accomplished using the probabilistic information along with relative distortion information to select symbols with the lowest estimated distortion to be included in the recovered signal. It is expected that in certain circumstances such a system will provide improved performance over other denoising and decoding systems.

Figure 21:
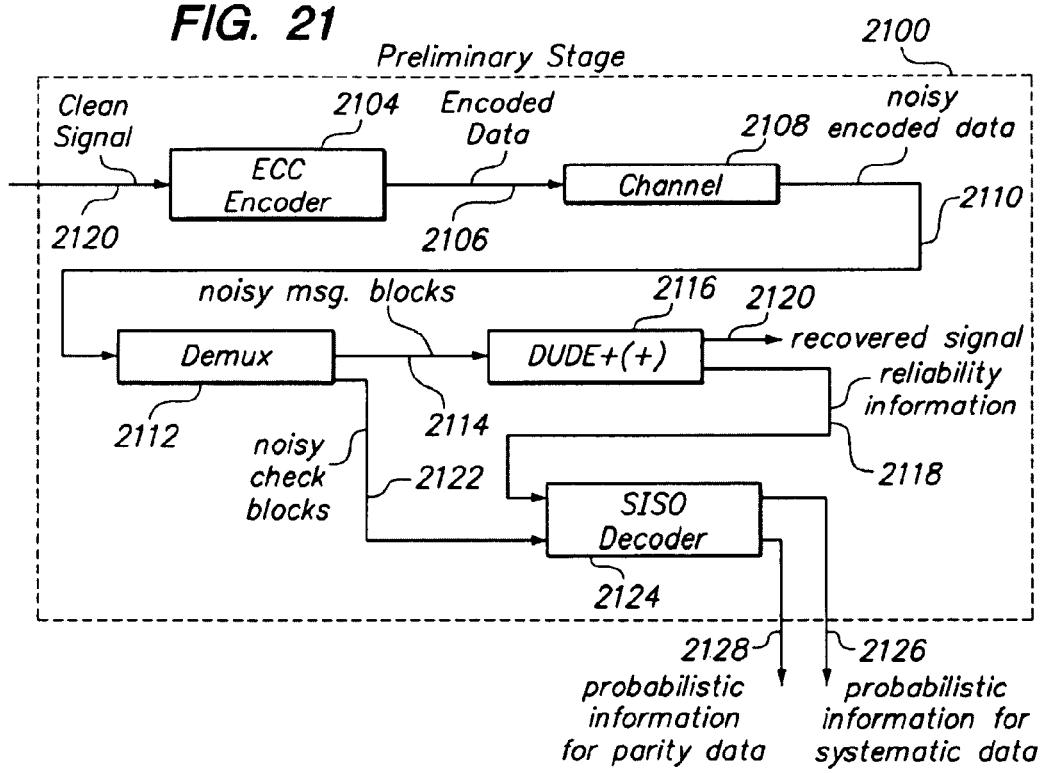
FIG. 21 illustrates a preliminary processing stage of a system for processing a noisy signal received from a noise-introducing channel including performing error correction in accordance with an embodiment of the present invention.

FIG. 21 illustrates a preliminary signal processing stage 2100 of a system for processing a noisy signal received from a noise-introducing channel including performing error correction in accordance with an embodiment of the present invention. As before, a clean original signal is represented as a sequence of symbols that are each members of an alphabet A having n distinct symbols. Prior to transmission via a noisy channel, the clean signal 2102 is passed through an ECC encoder 2104. The ECC encoder 2104 is a conventional error correction encoder that employs systematic error correction coding to generate an encoded data signal 2106. The encoded data signal 2106 is then transmitted via a noise-introducing channel 2108. A noisy encoded data signal 2110 is produced by the noise-introducing channel 2108. This signal 2110 is then applied to a de-multiplexer 2112 which separates message blocks in each code word from redundant check blocks which were added by the encoder 2104.

A noisy message block signal 2114 from the de-multiplexer 2112 is passed through a denoiser 2116 that performs the DUDE+ method described herein. Where a noise-introducing channel is a finite input, continuous output channel, the denoiser 2116 may perform the DUDE++ method described herein. The denoiser 2116 produces reliability information 2118. The denoiser 2116 may also produce a less noisy sequence of message blocks 2120. The data signal 2120 corresponds to the original clean signal 2102 after it has been passed through the noise introducing channel 2108 and the denoiser 2116. In an embodiment, this signal 2120 is not needed and, thus, need not be generated. For example, where the reliability information 2118 is output as a sequence of lists, each list being correlated in sequence to a particular symbol in the noisy signal, the noisy encoded data 2110, the noisy symbols 2114 or the less-noisy symbols 2120 need not be provided to decoder 2124. This is shown in FIG. 21. However, in an embodiment where the reliability information is output as lists that are not correlated in time or sequence to the particular symbols that occur in the noisy signal, then the noisy encoded data 2110, the noisy message symbols 2114 or the recovered signal 2120 may be provided to the decoder 2124 with appropriate modifications to the system of FIG. 21. In any case, the noisy check blocks 2122 are provided to the decoder 2124, though they may be included in the noisy encoded data 2110.

The noisy check blocks 2122 from the de-multiplexer 2112 are then passed to the decoder 2124, which is an appropriately configured, conventional soft-input, soft-output decoder. The decoder 2124 uses the reliability information 2118 from the denoiser 2116 and the redundant data introduced by the encoder 2104 to perform error correction. The output of the decoder 2124 includes a probabilistic information signal 2126 corresponding to the systematic data. The probabilistic information 2126 output from the stage 2100 generally does not consist of symbols from the alphabet for the input signal 2102. Rather, this information is of a general or continuous alphabet. As such, the probabilistic information may be further processed by applying the signal 2126 to the denoiser 1900 of FIG. 19. The output of the decoder 2124 may also include a probabilistic information signal 2128 corresponding to the parity data.

Thus, the stage 2100 may operate in the same manner as the system of FIG. 16, except that the soft-input decoder 1622 of FIG. 16 is replaced with the soft-input, soft-output decoder 2124.

Figure 22:
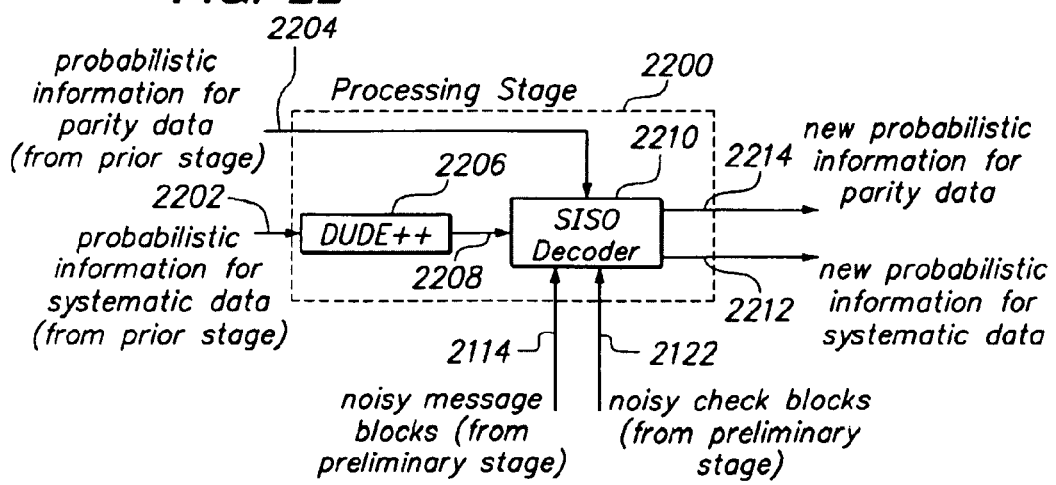
FIG. 22 illustrates a subsequent processing stage of a system for processing a noisy signal received from a finite input, general output channel including performing error correction in accordance with an embodiment of the present invention.

FIG. 22 illustrates a subsequent processing stage 2200 of a system for processing a signal received from a finite input, general output channel including performing error correction decoding in accordance with an embodiment of the present invention. The processing stage 2200 receives as input, probabilistic information 2202 for systematic data and parity data information 2204. The probabilistic information for systematic data 2202 is applied to a denoiser 2206 that implements the DUDE++ method described herein. Thus, the denoiser 2206 accepts the signal 2202 and generates a signal 2208 consisting of refined probabilistic information corresponding to systematic data, similar in form to the signal 2202.

The signal 2208 is applied to an appropriately configured, conventional soft-input soft-output decoder 2210, which uses the parity data information 2204 and the signal 2208 to perform error correction decoding. In an embodiment, the parity data information 2204 is in the form of probabilistic information corresponding to parity data. The decoder 2210 may also receive the noisy message blocks 2214 and the noisy check blocks 2122 from the preliminary processing stage 2100 (FIG. 21). In some circumstances, the values determined by the DUDE++ method for the conditional probabilities may not be between zero and one, which can cause difficulties for the decoder 2210 since most conventional soft-input decoders expect these values to be between zero and one. Therefore, steps are preferably performed to ensure that the values fall between zero and one. For example, the techniques described above in connection with the DUDE+ approach may be employed to ensure that the values fall between zero and one. These adjusted values can then be used to generate the probabilistic or reliability information (which could be in the form of likelihood ratios) for output.

The output of the decoder 2210 includes a probabilistic information signal 2212 corresponding to the systematic data. Due to the error correction decoding, the signal 2212 is expected to have probabilities placing greater weight on the correct symbols compared to the signal 2208. This output signal is similar in form to the output signal 2126 of the decoder 2124 of FIG. 21. In addition, output of the decoder 2210 may include a probabilistic information signal 2214 corresponding to the parity data. This output signal is similar in form the output signal 2128 of the decoder 2124 of FIG. 21.

Any number of additional subsequent stages, like the stage 2200, may be included in the system. The additional subsequent stages may be coupled in series with a first one of the subsequent stages coupled to receive the output of the stage 2200 so that the functions of the stage 2200 are performed recursively, further refining the results from each stage. Eventually, the enhanced probabilistic information output from a final stage may be converted into a recovered signal which is an estimate of the input signal before it passed through a noisy channel. This can be accomplished using the enhanced probabilistic information along with relative distortion information to select symbols with the lowest estimated distortion to be included in the recovered signal.

It should be noted that the DUDE+ and DUDE++ techniques can operate on the systematic portions (and reliabilities corresponding to systematic portions in the case of DUDE++) from more than one error correction code block at a time. For example, image data may broken up into numerous code blocks for error correction purposes, while the DUDE+ and DUDE++ algorithms ideally operate on the entire noisy image data aggregated into one signal, and not independently on the portions corresponding to the code blocks. Thus, there need not be a correspondence between the code block size and the amount of data that is operated on by the DUDE++ method. Because accuracy of the DUDE++ method is increased when the length of the signal is increased, the DUDE++ method may operate simultaneously on a plurality of the message blocks. Further, because all such message blocks must be received for the DUDE++ method to be applied to them, a tradeoff exists between the number of message blocks received before the DUDE++ method is applied and the time before DUDE++ output becomes available.

A parameter required by the DUDE++ algorithm at each denoising/decoding stage is the effective channel probability density function $f_i(y)$ characterizing the distribution of the continuous valued reliability information generated by the decoding operation of the previous stage for each possible value of the corresponding finite valued channel input symbol. In a preferred embodiment, this density information for each denoising/decoding stage is determined experimentally by executing the proposed denoising/decoding system up through the previous stage on numerous known training channel input signals and applying conventional probability density estimation techniques to the reliability information generated at the output of the previous stage. The estimated $f_i(y)$ can then be used by the DUDE++ algorithm at the corresponding denoising/decoding stage in the actual deployed system.

The SISO decoding algorithms such as belief propagation and turbo decoding are iterative in nature and maintain an internal state that is updated in each iteration. As is well known in the art, the internal state of the belief propagation algorithm, for instance, includes the likelihood messages most recently received by each check and variable node along each in-coming edge of the graphical model (Tanner graph) describing the LDPC code. Also part of the state is the current phase in the schedule of node updates. Also well known in the art is that each iteration of a SISO decoder generally involves accessing a-priori reliability or probabilistic information about each systematic and parity code symbol as well as channel reliability information indicating the likelihood of the observed channel output for each possible corresponding input. The a-priori probabilistic information about each systematic and parity code symbol and channel reliability information forms part of the state of the decoder before the iterations commence. In conventional implementations of iterative SISO decoding, the a-priori and channel reliability information associated with each codeword symbol is fixed across all iterations. In one embodiment of the present invention, the SISO decoder in each denoising/decoding processing stage 2200 (FIG. 22) is iterative and an arbitrary number iterations of are performed. The internal state of the decoding algorithm is preserved between denoising/decoding stages and the probabilistic output of each denoising phase (DUDE+ or DUDE++) of each denoising/decoding stage is used as the a-priori reliability information for the systematic codeword symbols in the decoding phase of that stage. The a-prior reliabilities for the parity symbols as well as the channel reliabilities for all symbols are left unchanged from one denoising/decoding stage to the next.

Approaches described above for denoising using error correction are described in E. Ordentlich, G. Seroussi, S. Verdú, K. Viswanathan, M. J. Weinberger, and T. Weissman, "Channel Decoding of Systematic Encoded Unknown Redundant Sources." pub. 2004, the entire contents of which are hereby incorporated by reference.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A system to process a noisy input signal, the system comprising:
a preliminary processing stage to form an intermediate noisy signal, the preliminary processing stage comprising:
a demultiplexer to separate noisy message blocks from noisy check blocks in the noisy input signal;
a first denoiser to determine first reliability information corresponding to each metasymbol occurring in the noisy message blocks, wherein each metasymbol provides a context for a symbol of the metasymbol and the first reliability information represents a probability that a value in the noisy input signal corresponding to a symbol of the metasymbol assumed each possible value; and
a first error correction decoder to perform error correction decoding on the noisy input signal using the noisy check blocks and the first reliability information to generate the intermediate noisy signal; and
a subsequent processing stage to process the intermediate noisy signal, the subsequent processing stage comprising:
a second denoiser; and
a second error correction decoder to operate on the intermediate noisy signal and on the noisy input signal.

2. The system according to claim 1, further comprising one or more additional subsequent stages to process a signal from a prior subsequent stage and the noisy input signal.

3. The system according to claim 1, wherein the second denoiser is to:
quantize the intermediate noisy signal to form a quantized signal having symbols of a finite alphabet; and
generate second reliability information corresponding to metasymbols in the intermediate noisy signal based on an estimate of the distribution of metasymbols in the noisy input signal and upon symbol transition probabilities of symbols in the noisy input signal being altered in the quantized signal, a portion of each metasymbol in the noisy input signal providing a context for a symbol of the metasymbol;
wherein the second error correction decoder performs error correction decoding on the noisy input signal using the second reliability information.

4. The system according to claim 3, wherein the estimate of the distribution is generated based on an empirical distribution of metasymbols in the quantized signal.

5. The system according to claim 3, wherein the estimate of the distribution is generated by multiplying a vector of an empirical distribution of metasymbols in the quantized signal by an inverse of a metasymbol-transition probability matrix, the metasymbol-transition probability matrix representing probabilities of metasymbols in the input signal being altered in the quantized signal.

6. The system according to claim 3, wherein the denoiser of the subsequent processing stage restores channel probability density information lost through the quantizing of the intermediate noisy signal received from the preliminary processing stage.

7. The system according to claim 1, wherein the first and second error correction decoders perform an iterative decoding algorithm wherein for each iteration, the first and second error correction decoders access a-priori probabilistic information regarding each systematic and parity code symbol and the respective first and second reliability information.

8. The system according to claim 7, wherein the a-priori probabilistic information regarding each systematic and parity code symbol and the first and second reliability information accessed by the first and second error correction decoders are fixed across all iterations and stages.

9. The system according to claim 7, wherein the second reliability information comprises the a-priori probabilistic information for the second decoder.

10. The system according to claim 7, wherein the first reliability information generated by the first denoiser comprises the a-priori probabilistic information for the first decoder.

11. A method of processing a noisy error correction coded input signal received through a noise-introducing channel, the method comprising:
separating noisy message blocks from noisy check blocks in the noisy error correction coded input signal;
for each metasymbol occurring in the noisy message blocks, determining a first reliability information, the first reliability information being in machine readable form and representing a probability that a value in the input signal corresponding to a symbol of the metasymbol assumed each of possible values;
applying the noisy check blocks and the first reliability information to a first error correction decoder to form an intermediate noisy signal having symbols of a general alphabet;
quantizing the intermediate noisy signal to form a quantized signal having symbols of a finite alphabet;
determining an empirical distribution of metasymbols in the quantized signal, each metasymbol comprising a series of the symbols of the finite alphabet;
determining an estimate of the distribution of metasymbols in the input signal from the empirical distribution of metasymbols in the quantized signal;
generating a second reliability information corresponding to metasymbols in the noisy intermediate signal based on the estimate of the distribution of metasymbols in the input signal and channel probability density information; and
applying the second reliability information to a second error correction decoder.

12. The method according to claim 11, further comprising restoring channel probability density information lost through said quantizing.

13. The method according to claim 11, further comprising applying an output of the second error correction decoders to one or more subsequent processing stages, each subsequent processing stage including a denoiser and an error correction decoder.

14. The method according to claim 12, wherein said restoring channel probability density information comprises:
multiplying the estimate of the distribution of metasymbols in the input signal by the channel probability density information evaluated at channel output values observed in the intermediate noisy signal to form a joint probability distribution of tuples of original and intermediate noisy symbols; and
wherein the generating of the second reliability information comprises summing the joint probability distribution over all values that the input symbols corresponding to context symbols can possibly take.

15. A system to process a noisy error correction coded input signal received through a noise-introducing channel comprising:
   a de-multiplexer to separate noisy message blocks from noisy check blocks in the noisy error correction coded signal;
   a first denoiser to determine first reliability information corresponding to each metasymbol occurring in the noisy message blocks, the first reliability information representing a probability that the value in the input signal corresponding to the symbol of a metasymbol assumed each of possible values;
   a first error correction decoder to form an intermediate noisy signal by performing error correction decoding on the noisy check blocks and the first reliability information, the intermediate noisy signal having symbols from a general alphabet;
   a second denoiser to generate second reliability information corresponding to metasymbols in the noisy intermediate signal based on counts of metasymbols in a quantized signal and upon symbol transition probabilities of symbols in the input signal being altered in the quantized signal, a portion of each metasymbol in the noisy intermediate signal providing a context for a symbol of the metasymbol and the quantized signal having symbols of a finite alphabet and being formed by quantizing the noisy intermediate signal; and
   a second error correction decoder to perform error correction decoding on the noisy error correction coded signal using the second reliability information.

16. The system according to claim 15, wherein the second denoiser restores channel probability density information lost through said quantizing.

17. The system according to claim 15, further comprising one or more subsequent processing stages coupled in series to receive an output of the second error correction decoder, each subsequent processing stage including a denoiser and an error correction decoder.

18. A computer-readable storage media comprising computer code for implementing a method of processing a noisy error correction coded input signal received through a noise-introducing channel, the code, when executed by a computer, is to cause the computer to:
   separate noisy message blocks from noisy check blocks in the noisy error correction coded signal;
   for each metasymbol occurring in the noisy message blocks, determine reliability information, the reliability information being in machine readable form and representing a probability that the value in the input signal corresponding to a symbol of the metasymbol assumed each of possible values;
   apply the noisy check blocks and the reliability information to a first error correction decoder to form an intermediate noisy signal having symbols of a general alphabet;
   quantize the intermediate noisy signal to form a quantized signal having symbols of a finite alphabet;
   determine an empirical distribution of metasymbols in the quantized signal, each metasymbol comprising a series of the symbols of the finite alphabet;
   determine an estimate of the distribution of metasymbols in the input signal based on the empirical distribution of metasymbols in the quantized signal;
   generate a second reliability information corresponding to metasymbols in the noisy intermediate signal based on the estimate of the distribution of metasymbols in the input signal and channel probability density information; and
   apply the second reliability information to a second error correction decoder.

* * * * *